United States Patent
Hakko

(10) Patent No.: US 11,592,750 B2
(45) Date of Patent: Feb. 28, 2023

(54) EXPOSURE APPARATUS, EXPOSURE METHOD, DECISION METHOD, AND ARTICLE MANUFACTURING METHOD

(71) Applicant: CANON KABUSHIKI KAISHA, Tokyo (JP)

(72) Inventor: Manabu Hakko, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/864,221

(22) Filed: May 1, 2020

(65) Prior Publication Data

US 2020/0363726 A1 Nov. 19, 2020

(30) Foreign Application Priority Data

May 17, 2019 (JP) .............................. JP2019-093918

(51) Int. Cl.
G03F 7/20 (2006.01)

(52) U.S. Cl.
CPC .................. *G03F 7/7015* (2013.01)

(58) Field of Classification Search
CPC . G03F 7/70091; G03F 7/70116; G03F 7/7015
See application file for complete search history.

(56) References Cited

U.S. PATENT DOCUMENTS

2004/0172610 A1* 9/2004 Liebmann ........... G03F 7/70125
716/53
2012/0052448 A1* 3/2012 Gyoda .................... G03F 7/705
430/322

FOREIGN PATENT DOCUMENTS

| JP | H06124870 A | | 5/1994 |
|---|---|---|---|
| JP | H1012524 A | | 1/1998 |
| JP | 2004247737 A | | 9/2004 |
| JP | 2018054992 A | * | 4/2018 |
| JP | 2018054992 A | | 4/2018 |
| TW | 200844676 A | | 11/2008 |
| TW | 200942975 A | | 10/2009 |

OTHER PUBLICATIONS

Office Action issued in Taiwanese Appln. No. 109114293 dated Sep. 29, 2022. English translation provided.

\* cited by examiner

*Primary Examiner* — Steven Whitesell Gordon
(74) *Attorney, Agent, or Firm* — Rossi, Kimms & McDowell LLP

(57) ABSTRACT

Exposure apparatus includes illumination optical system and projection optical system for forming projected image with light from the illumination optical system. The illumination optical system forms, on pupil plane of the illumination optical system, light emission region including first and second regions. The projected image is composited from images including first image formed by first light from the first region and second image formed by second light from the second region. The first light and/or the second light is broadband light. Increase/decrease change in line width in the second image caused by defocus has different sign with respect to increase/decrease change in line width in the first image caused by defocus, and increase/decrease change in line width in image obtained by compositing the first image and the second image, which is caused by defocus, is decreased.

18 Claims, 18 Drawing Sheets

FIG. 4A
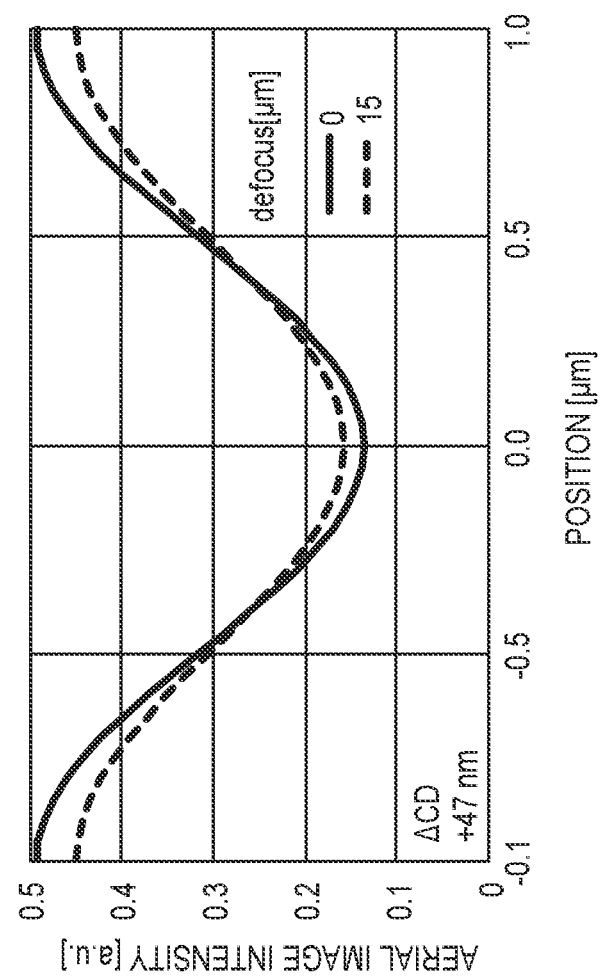
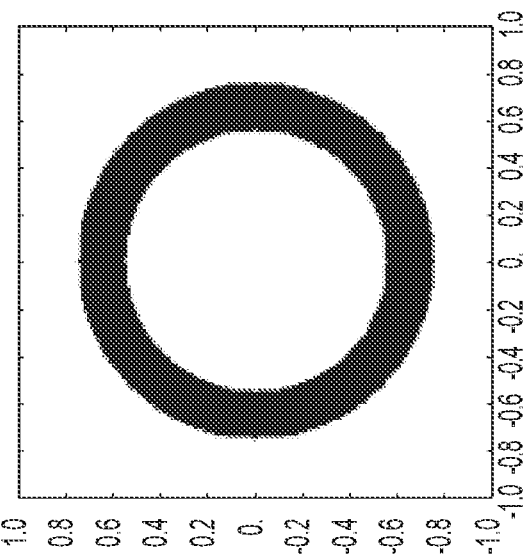

FIG. 4B
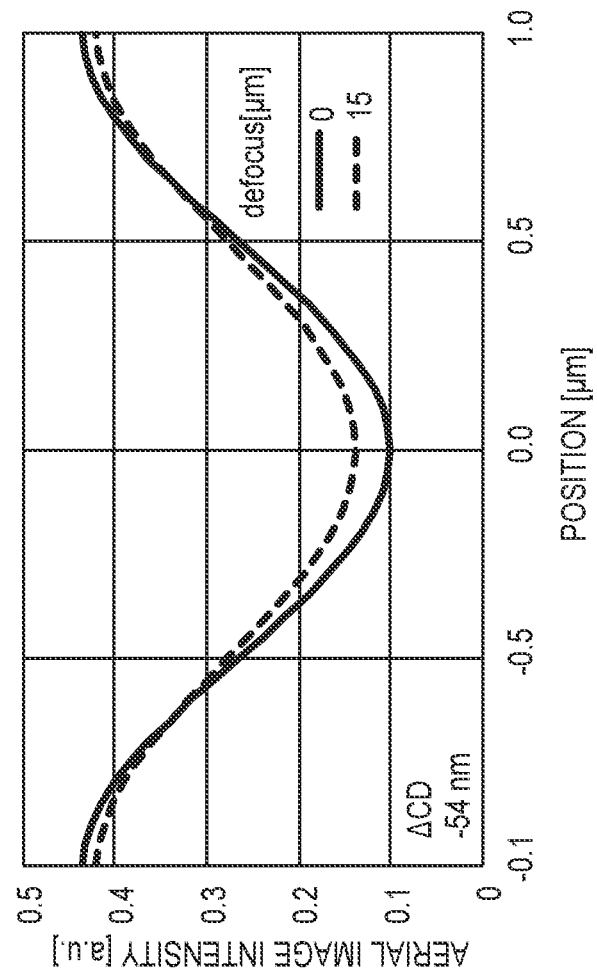
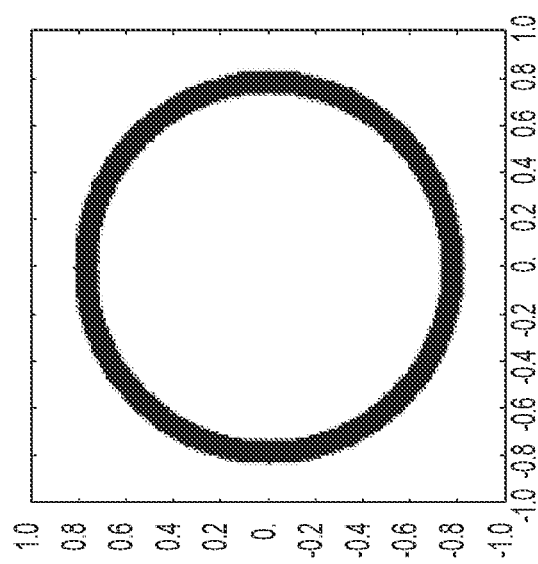

FIG. 4C
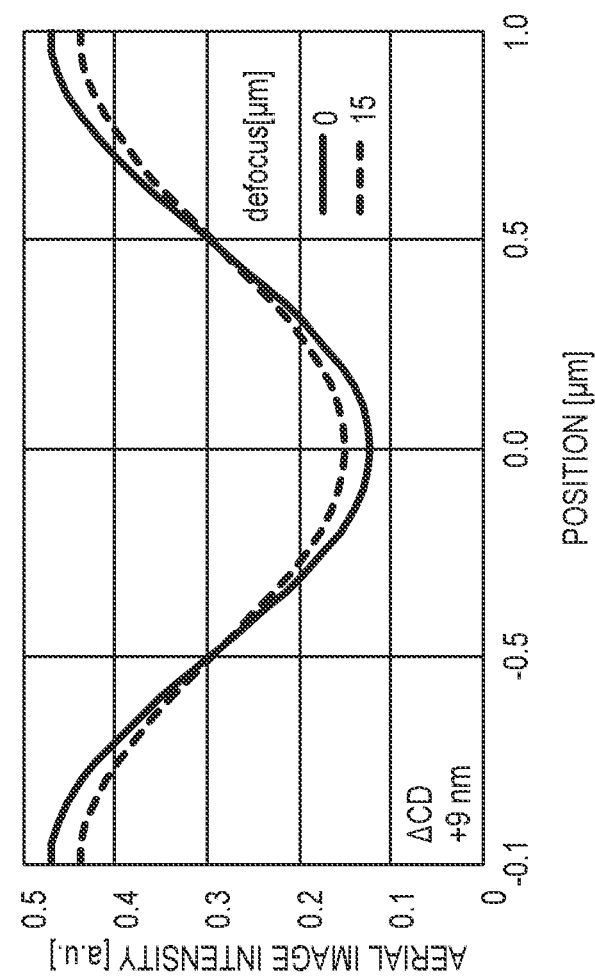
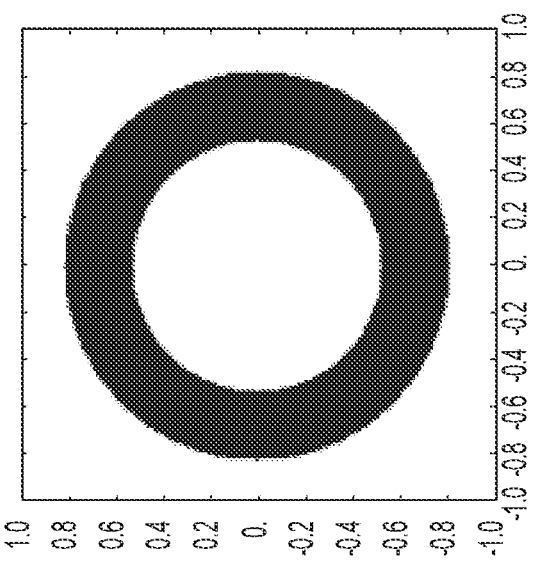

FIG. 5

| LIGHT EMISSION REGION | COMPARATIVE EXAMPLE | EXAMPLE 1 |
|---|---|---|
| WAVELENGTH [nm] | 270~390 | 270~350 |
| ILLUMINATION ANGLE | INNER σ 0.55, OUTER σ 0.85 | |
| IMAGE CONTRAST | 0.52 | 0.59 |
| DOF [μm] | 30.9 | 32.2 |
| END LINE WIDTH [nm] | 745 | 799 |
| SIDE WALL ANGLE [°] | 69.4 | 72.6 |

FIG. 8

| LIGHT EMISSION REGION | | COMPARATIVE EXAMPLE 3 | EXAMPLE 3 |
|---|---|---|---|
| FIRST REGION | WAVELENGTH [nm] | 270~390 | 270~330 |
| | ILLUMINATION ANGLE | INNER σ:0.45 OUTER σ:0.85 | INNER σ:0.45 OUTER σ:0.60 |
| SECOND REGION | WAVELENGTH [nm] | — | 330~390 |
| | ILLUMINATION ANGLE | — | INNER σ:0.70 OUTER σ:0.85 |
| IMAGE CONTRAST | | 0.68 | 0.69 |
| DOF [μm] | | 33.4 | 45.3 |
| END LINE WIDTH [nm] | | 1034 | 1011 |
| SIDE WALL ANGLE [°] | | 72.9 | 73.4 |

F I G. 10

| | | A | B | C | D |
|---|---|---|---|---|---|
| FIRST REGION | WAVELENGTH [nm] | 270~350 | 270~350 | 270~350 | 270~350 |
| | ILLUMINATION ANGLE | INNER σ 0.55 OUTER σ 0.70 | INNER σ 0.45 OUTER σ 0.65 | INNER σ 0.55 OUTER σ 0.70 | INNER σ 0.55 OUTER σ 0.70 |
| SECOND REGION | WAVELENGTH [nm] | 350~390 | 270~390 | 270~390 | 365 |
| | ILLUMINATION ANGLE | INNER σ 0.70 OUTER σ 0.85 | INNER σ 0.65 OUTER σ 0.85 | INNER σ 0.70 OUTER σ 0.85 | INNER σ 0.70 OUTER σ 0.85 |

FIRST REGION I1
SECOND REGION I2

FIRST REGION I1
SECOND REGION I2
THIRD REGION I3

FIRST REGION I1
SECOND REGION I2

FIRST REGION I1
SECOND REGION I2

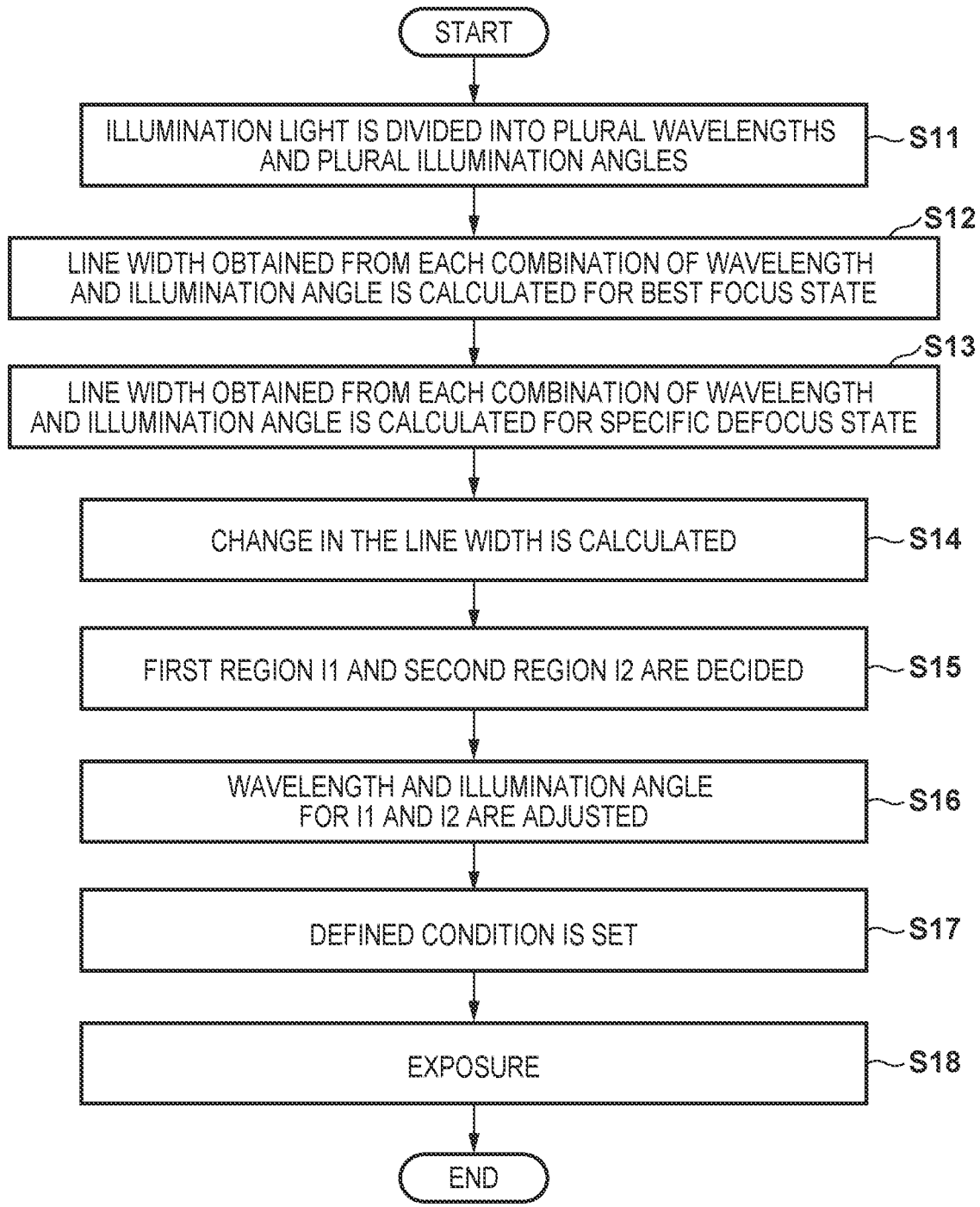

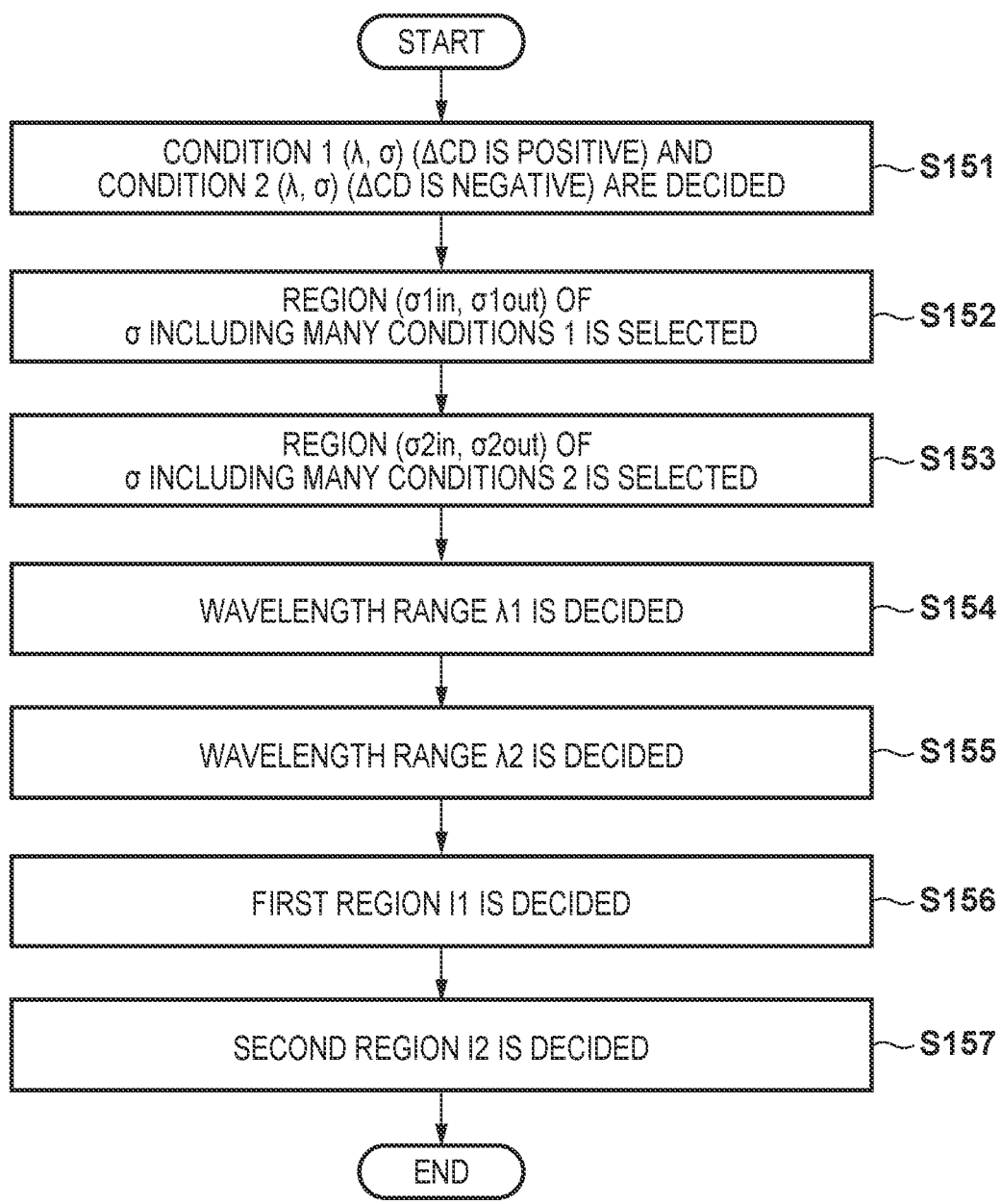

EXPOSURE APPARATUS, EXPOSURE METHOD, DECISION METHOD, AND ARTICLE MANUFACTURING METHOD

BACKGROUND OF THE INVENTION

Field of the Invention

The present invention relates to an exposure apparatus, an exposure method, a decision method, and an article manufacturing method.

Description of the Related Art

An exposure apparatus can expose a substrate by projecting the pattern of an original (mask) onto the substrate. One exposure apparatus projects the pattern of an original onto a substrate by a projection optical system while illuminating the original by an illumination optical system. The illumination optical system illuminates an optical integrator with light from a light source to generate a secondary light source on the exit surface of the optical integrator corresponding to the pupil plane of the illumination optical system. The secondary light source is formed by a light emission region having a predetermined shape and a predetermined size. The light emission region constituting the secondary light source corresponds to the angle distribution of light that illuminates points of the original. As another exposure apparatus, there also exists a maskless exposure apparatus that does not use an original (mask).

As a technique of improving performance for transferring a fine pattern, RET (Resolution Enhancement Techniques) exist. As one of the RET techniques, modified illumination for optimizing the angle distribution of light that illuminates points of an original is known. Japanese Patent Laid-Open No. 10-12524 discloses a method of reducing the pattern dependence of a focal depth in a modified illumination exposure method. This method reduces the pattern dependence of a focal depth by interrupting exposure during an exposure process and rotating an aperture (stop) for modified illumination with respect to the optical axis. Japanese Patent Laid-Open No. 2018-54992 discloses a method of reducing the line width difference (line width unevenness caused by the direction difference between patterns) between patterns in a plurality of directions. In this method, the wavelength of a light emission region contributing to imaging of a pattern in a direction in which the image contrast is relatively low is shifted to a short wavelength side.

The technique described in Japanese Patent Laid-Open No. 10-12524 has an effect of reducing the pattern dependence of a focal depth when modified illumination as one of the RET techniques is used. However, the technique described in Japanese Patent Laid-Open No. 10-12524 does not optimize the stop shape and the wavelength range to improve the focal depth itself. For this reason, the technique described in Japanese Patent Laid-Open No. 10-12524 cannot obtain an effect of sufficiently improving the focal depth to a fine pattern. The technique described in Japanese Patent Laid-Open No. 2018-54992 is a technique of solving the line width unevenness caused by the direction difference between patterns in a case in which broadband illumination light is used, and is not a technique of improving the focal depth to a fine pattern, that is, RET.

SUMMARY OF THE INVENTION

It is an object of the present invention to provide a technique advantageous in improving a focal depth when forming a projected image on a substrate.

One of aspects of the present invention provides an exposure apparatus including an illumination optical system, and a projection optical system configured to form a projected image on a substrate with light provided from the illumination optical system, wherein the illumination optical system forms, on a pupil plane of the illumination optical system, a light emission region including a first region and a second region, the projected image is composited from a plurality of images including a first image formed by first light from the first region and a second image formed by second light from the second region, at least one of the first light and the second light is broadband light, and an increase/decrease change in a line width in the second image caused by defocus has a different sign with respect to an increase/decrease change in a line width in the first image caused by defocus, and an increase/decrease change in a line width in an image obtained by compositing the first image and the second image, which is caused by defocus, is decreased.

Further features of the present invention will become apparent from the following description of exemplary embodiments with reference to the attached drawings.

BRIEF DESCRIPTION OF THE DRAWINGS

FIGS. 4A to 4C show views exemplarily showing a change in a line width caused by defocus;

FIG. 5 is a view showing Example 1;

FIG. 8 is a view showing Example 3;

FIG. 10 is a view showing Example 5;

FIG. 13 is a flowchart showing an exposure method and an exposure method decision method according to an embodiment; and FIG. 14 is a flowchart showing an exposure method and an exposure method decision method according to an embodiment.

DESCRIPTION OF THE EMBODIMENTS

Figure 1:
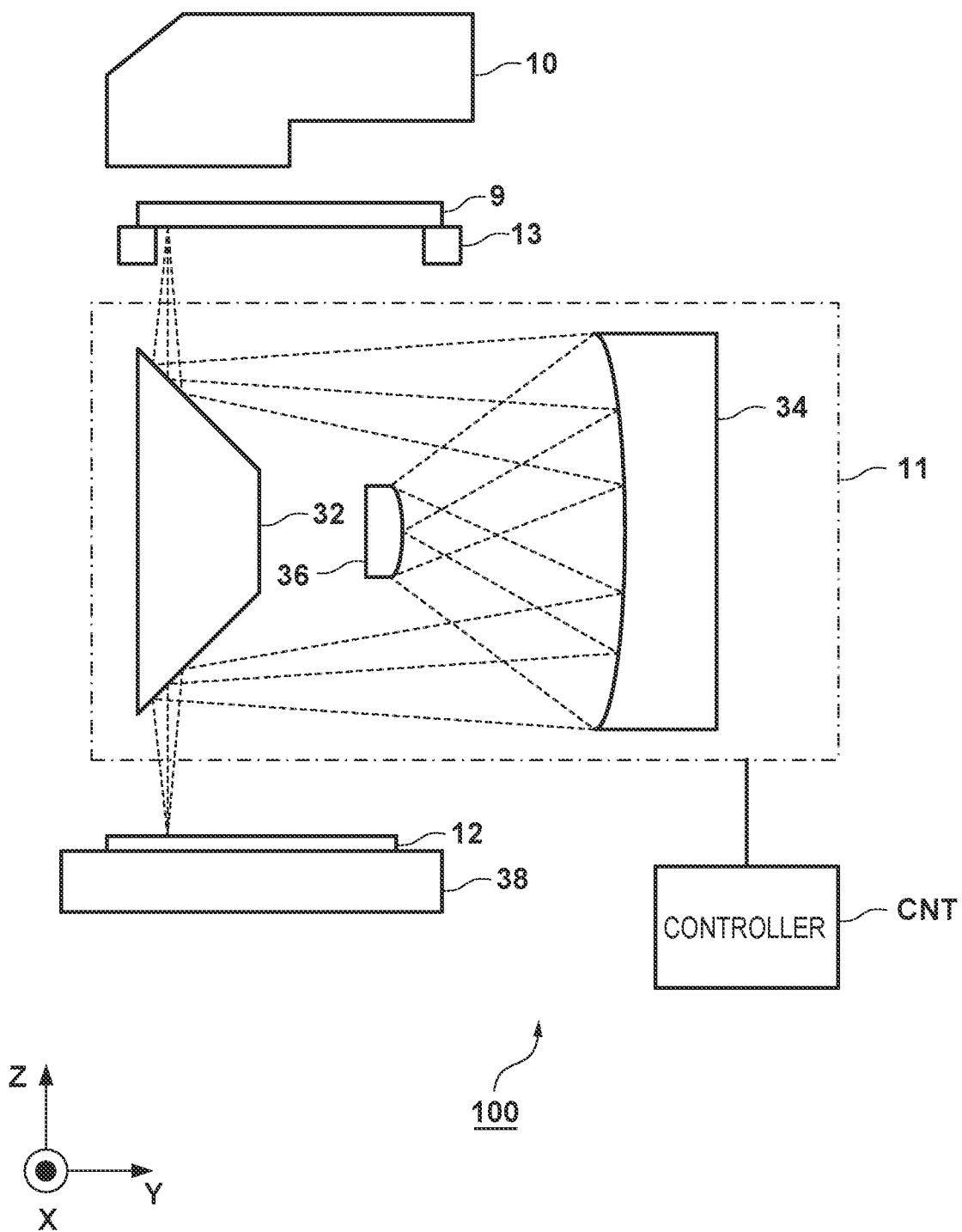
FIG. 1 is a view showing the arrangement of an exposure apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 shows the arrangement of an exposure apparatus 100 according to an embodiment of the present invention. The exposure apparatus 100 can illuminate an original 9 with light (illumination light) including a plurality of wavelength ranges and transfer the pattern of the original 9 onto a substrate 12. The exposure apparatus 100 is suitable to manufacture a flat panel display, a semiconductor element, a MEMS, and the like and, more particularly, to manufacture a flat panel display. The exposure apparatus 100 can include an illumination optical system 10, and a projection optical system 11 configured to form a projected image on the substrate 12 by light provided from the illumination optical system 10. The exposure apparatus 100 can further include an original stage mechanism 13 configured to drive or position the original (mask) 9, and a substrate stage mechanism 38 configured to drive or position the substrate 12. The illumination optical system 10 can include a light source and illuminate the original 9 with light from the light source. The original 9 can be arranged on the object surface of the projection optical system 11, and the substrate 12 can be arranged on the image plane of the projection optical system 11.

The projection optical system 11 is formed by, for example, a reflection optical system. The reflection optical system can include, for example, mirrors 32, 34, and 36, and reflect light from the original 9 sequentially by the mirrors 32, 34, 36, 34, and 32 to form the projected image of the original 9 on the substrate 12. If the projection optical system 11 is formed by the reflection optical system, the chromatic aberration of the light from the light source is smaller than that in a refraction optical system. This arrangement is suitable when broadband light (broadband illumination light) including a plurality of wavelength ranges is used. The substrate stage mechanism 38 can include a stage configured to hold the substrate 12, and a driving mechanism configured to drive the stage.

The exposure apparatus 100 can include a control unit CNT that controls the illumination optical system 10, the projection optical system 11, the substrate stage mechanism 38, and the like. The control unit CNT can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components.

Figure 2:
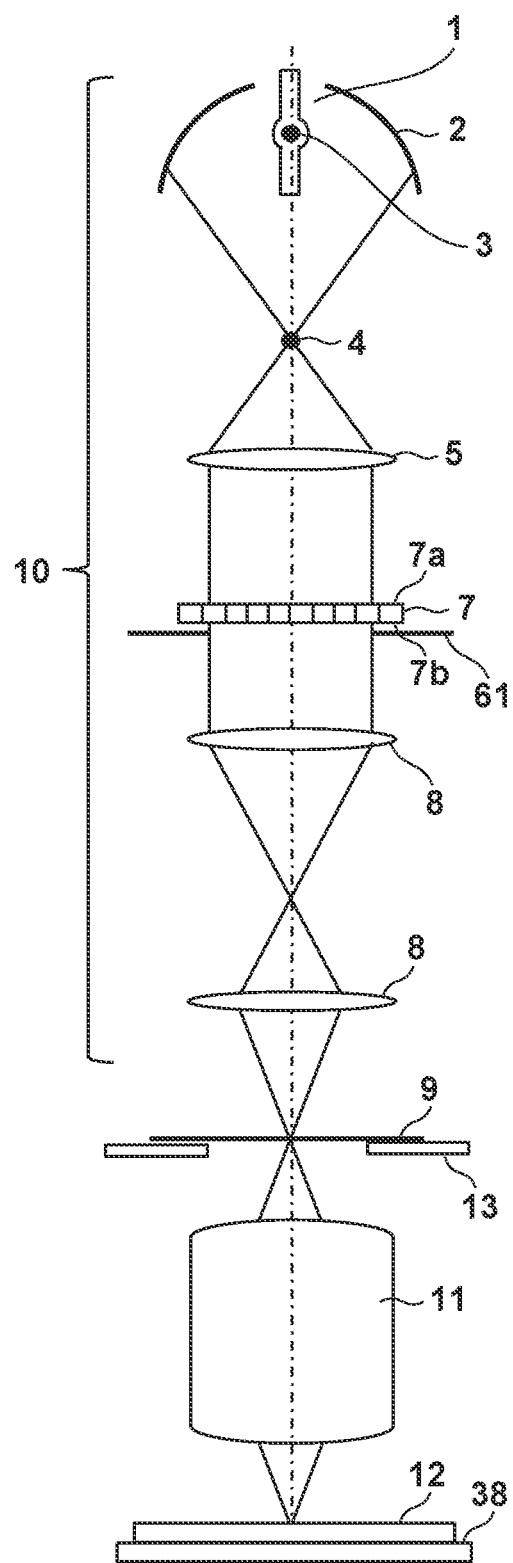
FIG. 2 is a view showing the arrangement of an illumination optical system according to an embodiment.

FIG. 2 shows an example of the arrangement of the illumination optical system 10. The illumination optical system 10 can include, for example, a light source 1, a condenser mirror 2, a condenser lens 5, a fly-eye lens 7, condenser lenses 8, and an aperture stop 61. Although not illustrated in FIG. 2, an optical system configured to shape light from the light source 1 such that the cross section of the light to illuminate the original 9 has a predetermined shape and a predetermined size can be arranged in the optical path between the condenser lens 5 and the original 9. The light source 1 is, for example, a mercury lamp, and can emit broadband light whose wavelength ranges from 270 nm to 390 nm. The light source 1 includes a light emitting portion near a first focal point 3 of the condenser mirror 2, and the condenser mirror 2 can condense the light emitted by the light source 1 to a second focal point 4.

The condenser lens 5 can convert the light condensed to the second focal point 4 into parallel light. The light converted by the condenser lens 5 can enter an incident surface 7a of the fly-eye lens 7. The fly-eye lens 7 is an optical integrator formed by a plurality of optical elements, more specifically, a plurality of fine lenses. The fly-eye lens 7 forms, on an exit surface 7b (light exit surface), a secondary light source from the light that has entered the incident surface 7a. The light that has exited from the fly-eye lens 7 can superposingly illuminate the original 9 via the plurality of condenser lenses 8. The original 9 can be held by the original stage of the original stage mechanism 13. A measurement unit (not shown) can be arranged on the substrate stage of the substrate stage mechanism 38. The measurement unit can include an image sensor, for example, a CCD sensor capable of measuring the shape or light intensity of the secondary light source formed on the exit surface 7b of the fly-eye lens 7.

Modified illumination (oblique incidence illumination) such as annular illumination (a distribution of annular shapes) or quadrupole illumination, which is one of resolution enhancement techniques (RET), is effective for improving the focal depth of the projection optical system 11 and the contrast of a projected image formed by the projection optical system 11. The annular illumination is defined by an inner σ that is the inner radius of an annular-shaped light emission region (effective light source distribution) and an outer σ that is the outer radius. Modified illumination having a predetermined light emission region (intensity distribution) can be implemented by, for example, an aperture stop 61 arranged on the exit surface 7b of the fly-eye lens 7 (optical integrator) corresponding to the pupil plane of the illumination optical system 10.

In conventional modified illumination, the illumination angle σ of the light emission region is optimized to improve imaging performance. Here, when expressed by pupil coordinates, the illumination angle σ corresponds to the distance (radius) from the origin. For example, for modified illumination, the above-described inner σ and outer σ are optimized. On the other hand, in this embodiment, a light emission region (effective light source distribution) formed by a plurality of regions including a first region I1 and a second region I2 is formed on the pupil plane of the illumination optical system 10. The first region and the second region can be regions exclusive of each other, but may not be regions exclusive of each other. Additionally, in this embodiment, the projected image formed on the substrate 12 is composited from a plurality of light intensity distributions including a first image formed on the substrate 12 by first light in a first wavelength range from the first region I1 and a second image formed on the substrate 12 by second light in a second wavelength range from the second region I2. In this embodiment, a change in a line width in the first image caused by defocus is reduced or, preferably, canceled by a change in a line width in the second image caused by defocus. Defocus can occur due to a change in the height of the substrate 12 or a change in the height of a resist applied to the substrate.

The modified illumination is a technique developed in an exposure apparatus for manufacturing a semiconductor element. In an exposure apparatus for manufacturing a semiconductor element, since the spectrum of light emitted by a light source is narrow (the full width at half maximum is less than 10 nm), a wavelength λ of the light is handled as a single value. On the other hand, in an exposure apparatus for manufacturing a flat panel display, broadband illumination in which light emitted by a light source has a wide spectrum (the full width at half maximum is 10 nm or more) can be used. For example, when the i-line of a mercury lamp is used, the full width at half maximum is about 6 nm. Also, when a plurality of bright lines (g-, h-, and i-lines) generated by a mercury lamp are used, the wavelength width is 80 nm or more. Even in the exposure apparatus for manufacturing a flat panel display, conventionally, the light emission region of modified illumination has been handled as a region having the single wavelength λ (for example, a wavelength of a highest intensity or a centroid wavelength with a weighted intensity) as in the exposure apparatus for manufacturing a semiconductor element. The expression "broadband" is used in a sense of discriminating it from an expression "narrow band" in which the full width at half maximum is small, like a KrF laser beam or an ArF laser beam. More specifically, in this specification, the expression "broadband" means light whose full width at half maximum is 10 nm or more. Here, the full width at half maximum is an amount called FWHM, and corresponds to the wavelength width of a spectrum. In addition, the expression "broadband light" can mean light having a bandwidth including a plurality of bright lines.

In this embodiment, the illumination wavelength λ can also be optimized in addition to the illumination angle σ of the light emission region in the modified illumination. When the illumination wavelength λ is optimized, an effect of increasing the focal depth can be obtained. When optimizing the illumination angle σ and the illumination wavelength λ an idea of dividing an illumination region into two or more regions and considering a change in a line width (CD) in an image by defocus of the image formed by light from each region has not conventionally existed. This embodiment is novel and useful as a RET technique particularly for broadband illumination light.

As an equation representing the relationship between the illumination wavelength λ and a resolving power (R) and an equation representing the relationship between the illumination wavelength λ and the focal depth (DOF), Rayleigh's formulas represented by equations (1) and (2) are known, where NA is the numerical aperture of the projection optical system, and $k_1$ and $k_2$ are process constants. In the Rayleigh's formulas, the resolving power (R) improves as the wavelength becomes short, as indicated by equation (1). On the other hand, as indicated by equation (2), the focal depth (DOF) degrades as the wavelength becomes short. It is known that the resolving power and the focal depth have a trade-off relationship, and both the resolving power and the focal depth are difficult to improve. As a technique of improving both the resolving power and the focal depth, modified illumination that is one of the RET techniques is known.

$$R = K_1 \cdot \lambda / NA \quad (1)$$

$$DOF = K_2 \cdot \lambda / NA^2 \quad (2)$$

Several examples will be described below.

Example 1

Figure 3:
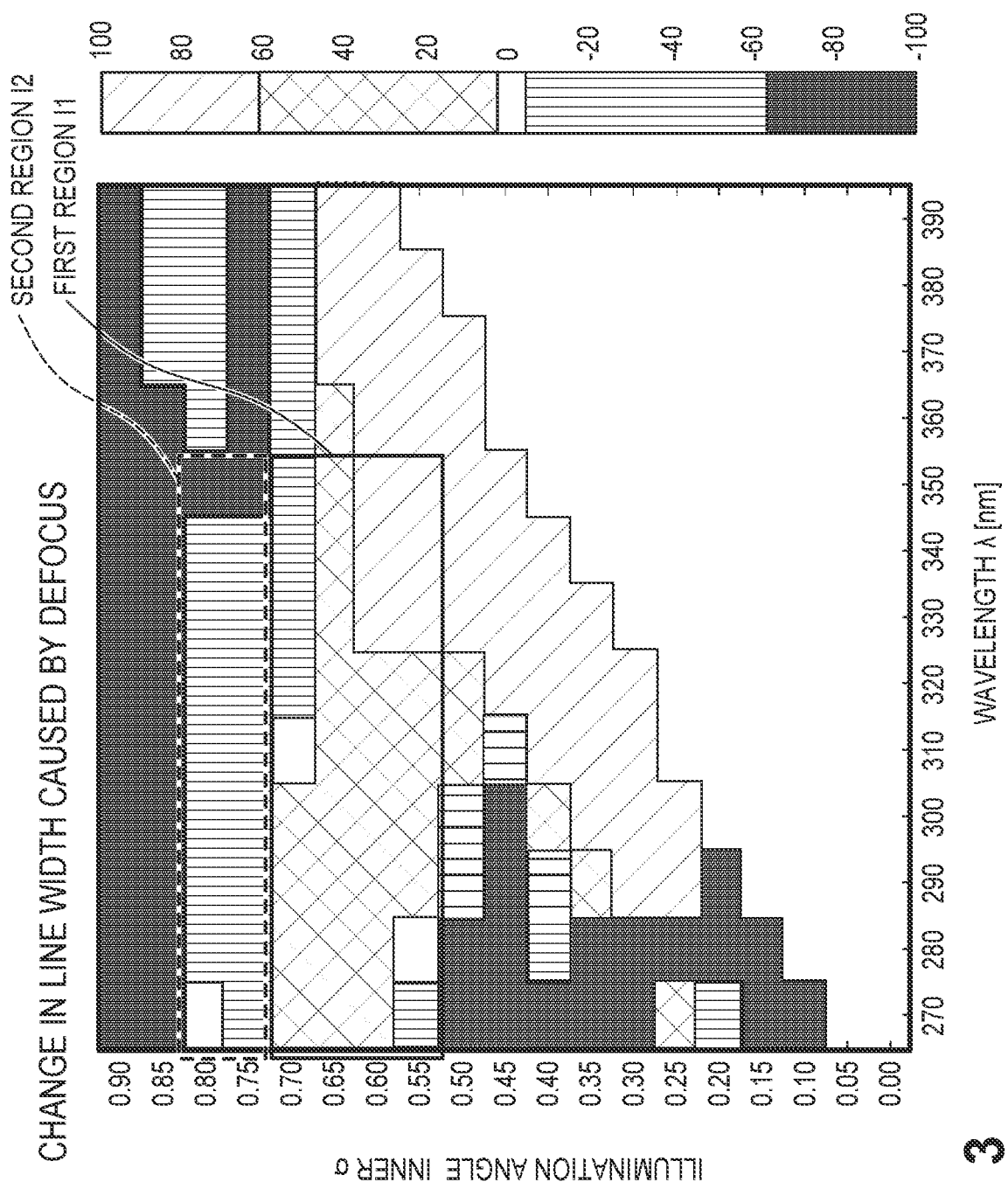
FIG. 3 is a view exemplarily showing a change in a line width caused by defocus.

FIG. 3 shows a change in a line width caused by defocus (15 μm) of an image (image intensity) formed on a substrate in modified illumination (annular illumination), in which the wavelength λ of the light emission region is plotted along the abscissa, and the inner σ is plotted along the ordinate. The wavelength λ was changed from 270 nm to 390 nm, and as for the illumination angle, the inner σ was changed from 0.00 to 0.90. At this time, the outer σ was inner σ+0.05, and changed from 0.05 to 0.95. These illumination conditions correspond to illumination with a very thin annular width of 0.05. The numerical aperture NA of the projection optical system was 0.12, and the exposure pattern was a 7-line and space pattern with a line width of 1 μm. A line width change caused by defocus was of the center line (the center line in the seven lines). The image intensity may be calculated in consideration of the aberration (chromatic aberration) of the projection optical system.

A region indicated by hatching and a region indicated by cross hatching represent illumination conditions under which the line width is increased by defocus. A region indicated by vertical lines and a region indicated by gray represent illumination conditions under which the line width is decreased by defocus. More specifically, the region indicated by hatching corresponds to illumination conditions under which the change in the line width is larger than 60 nm, and the region indicated by cross hatching corresponds to illumination conditions under which the change in the line width is larger than 0 and equal to or smaller than 60 nm. A region indicated by white represents illumination conditions under which the line width is not changed by defocus. The region indicated by vertical lines corresponds to illumination conditions under which the increase/decrease change in the line width is smaller than 0 and equal to or larger than −60 nm. The region indicated by gray corresponds to illumination conditions under which the increase/decrease change in the line width is smaller than −60 nm. That the increase/decrease change in the line width is positive (+) means that the line width is increased by defocus, and that the increase/decrease change in the line width is negative (−) means that the line width is decreased by defocus. "The increase/decrease change in the line width is positive" and "the increase/decrease change in the line width is negative" can be expressed as "the directions of the increase/decrease changes in the line width are opposite". Alternatively, "the increase/decrease change in the line width is positive" and "the increase/decrease change in the line width is negative" can be expressed as "the increase/decrease changes in the line width have signs different from each other". An "increase/decrease change in the line width" will be referred to as a "change in the line width" hereinafter.

FIG. 3 shows that when the illumination wavelength λ and the illumination angle σ of the light emission region are changed, the amount of the change in the line width caused by defocus (15 μm) and the direction or sign (positive/negative) of the change in the line width change. By controlling the wavelength range and the illumination angle range of the light emission region, the change in the line width caused by defocus can be controlled. The performance of annular illumination with an annular width larger than 0.05, for example, annular illumination with an inner σ of 0.55 and an outer σ of 0.75 can be estimated from the sum of image performances corresponding to 0.55, 0.60, 0.65, and 0.70 on the ordinate in FIG. 3. This is because images formed on the substrate by different illumination regions are incoherent to each other, and therefore, an image intensity formed by thick annular illumination can be calculated based on the sum of image intensities formed by thin annular illuminations without considering interference of weakening each other. Since the image intensities of different wavelengths are also incoherent to each other, an image intensity in a broadband wavelength range can be calculated by the sum of image intensities in narrow wavelength ranges. The annular width and the wavelength width are preferably set as wide as possible to obtain a high illuminance to improve throughput.

For example, in FIG. 3, in the first light emission region I1 (broadband light with a wavelength of 270 nm (inclusive) to 350 nm (inclusive), inner σ: 0.55, and outer σ: 0.75) indicated by a solid line, a region in which the change in the line width is positive is larger than a region in which the change in the line width is negative. On the other hand, in the second light emission region I2 (broadband light with a wavelength of 270 nm (inclusive) to 350 nm (inclusive), inner σ: 0.75, and outer σ: 0.85), there is no region in which the change in the line width is positive, and only a region in which the change in the line width is negative exists. For this reason, as shown in FIGS. 4A to 4C, an image intensity distribution (first image) formed by light (first light) from the first light emission region I1 exhibits a positive line width change (+47 nm) by defocus. In addition, an image intensity distribution (second image) formed by light (second light) from the second light emission region I2 exhibits a negative line width change (−54 nm). The line width changes caused by defocus of the image intensity distributions (the first image and the second image) formed by the first light and the second light from the first light emission region I1 and the second light emission region I2 have signs different from each other. In other words, when the line width in the first image is increased by defocus, the line width in the second image can be decreased by defocus.

Hence, if illumination is performed in both the first light emission region I1 and the second light emission region I2, the change in the line width in the first image caused by defocus is reduced by the change in the line width in the second image caused by defocus to +9 nm. This means that the change in the line width caused by defocus can be made small, in other words, the focal depth can be increased by compositing the projected image to be formed on the substrate from the first image and the second image.

In Example 1, both the first light emission region I1 and the second light emission region I2 were formed by broadband light. Even if one of the regions is formed by narrowband light (for example, a wavelength of 290 nm), at least part of the change in the line width caused by defocus is canceled, as is apparent from FIG. 3. Hence, it is necessary to form at least one of the first light emission region I1 and the second light emission region I2 by broadband light.

As described above, the light emission region on the pupil plane is divided into the first region I1 and the second region I2, and the image intensity of a projected image formed when both the first region I1 and the second region I2 emit light can be considered using image intensities formed by the first region I1 and the second region I2. Such way of thinking is possible because images formed by light in wavelength ranges different from each other are incoherent to each other, and images formed by light from light emission regions σ different from each other are incoherent to each other, as described above.

To divide the light emission region such that the changes in the line width caused by defocus have signs different from each other, a plurality of methods can exist. In this case, using an index other than the change in the line width caused by defocus, one method can be selected from the plurality of methods for making changes in the line width caused by defocus have signs different from each other. As an index other than the change in the line width caused by defocus, for example, a contrast, an illuminance, an MEEF (Mask Error Enhancement Factor), or the like can be used.

FIG. 5 shows comparison between a comparative example and Example 1. An end line width is the width of a line arranged at an end in a plurality of (in this example, seven) lines. All indices other than the end line width are of the line arranged at the center. In the comparative example, annular illumination using broadband light having a wavelength of 270 to 390 nm, an inner σ of 0.55, and an outer σ of 0.85 was used. In the comparative example, dividing the light emission region into two regions is not taken into consideration, and as a matter of course, making changes in the line width caused by defocus of two images formed by light beams from the two divided regions have signs different from each other is not taken into consideration.

In Example 1, annular illumination using broadband light having a wavelength of 270 nm to 350 nm, an inner σ of 0.55, and an outer σ of 0.85 was used. The illumination of Example 1 corresponds to illumination for forming a projected image by light beams from both the first region I1 and the second region I2 shown in FIGS. 4A to 4C. As described above, the first region I1 and the second region I2 are set such that the changes in the line width caused by defocus have signs different from each other. As compared to the comparative example, the image contrast improved from 0.52 to 0.59. This is the effect obtained by shortening the wavelength. Although the wavelength was shortened, the focal depth (DOF) increased from 30.9 µm to 32.2 µm. Since the inner σ and the outer σ in the comparative example equal those in Example 1, the effects of modified illumination also equal between the comparative example and Example 1. For this reason, the DOF in Example 1 increased as compared to the comparative example not as the effect of oblique incidence illumination of annular illumination but as the effect of the change in the wavelength.

In Example 1, although the wavelength was shorter than in the comparative example, the focal depth (DOF) increased. This is an effect that cannot be predicted by the Rayleigh's formula represented by equation (1). This effect was obtained because the projected image was formed by the light beams from both of the first region I1 and the second region I2, and therefore, at least part of the change in the line width caused by defocus was canceled, and the focal depth increased. The line width in the best focus of the line arranged at the end of the 7-line and space pattern improved from 745 nm to 799 nm. The side wall angle of the line pattern improved from 69.4° to 72.6°. As described above, the focal depth and the resolving power have a trade-off relationship, and in the comparative example, both the focal depth and the resolving power are difficult to improve. In Example 1, when the image contrast and the side wall angle were used as the indices of resolving power, an effect of improving both the focal depth and the resolving power was obtained.

Example 2

Figure 6:
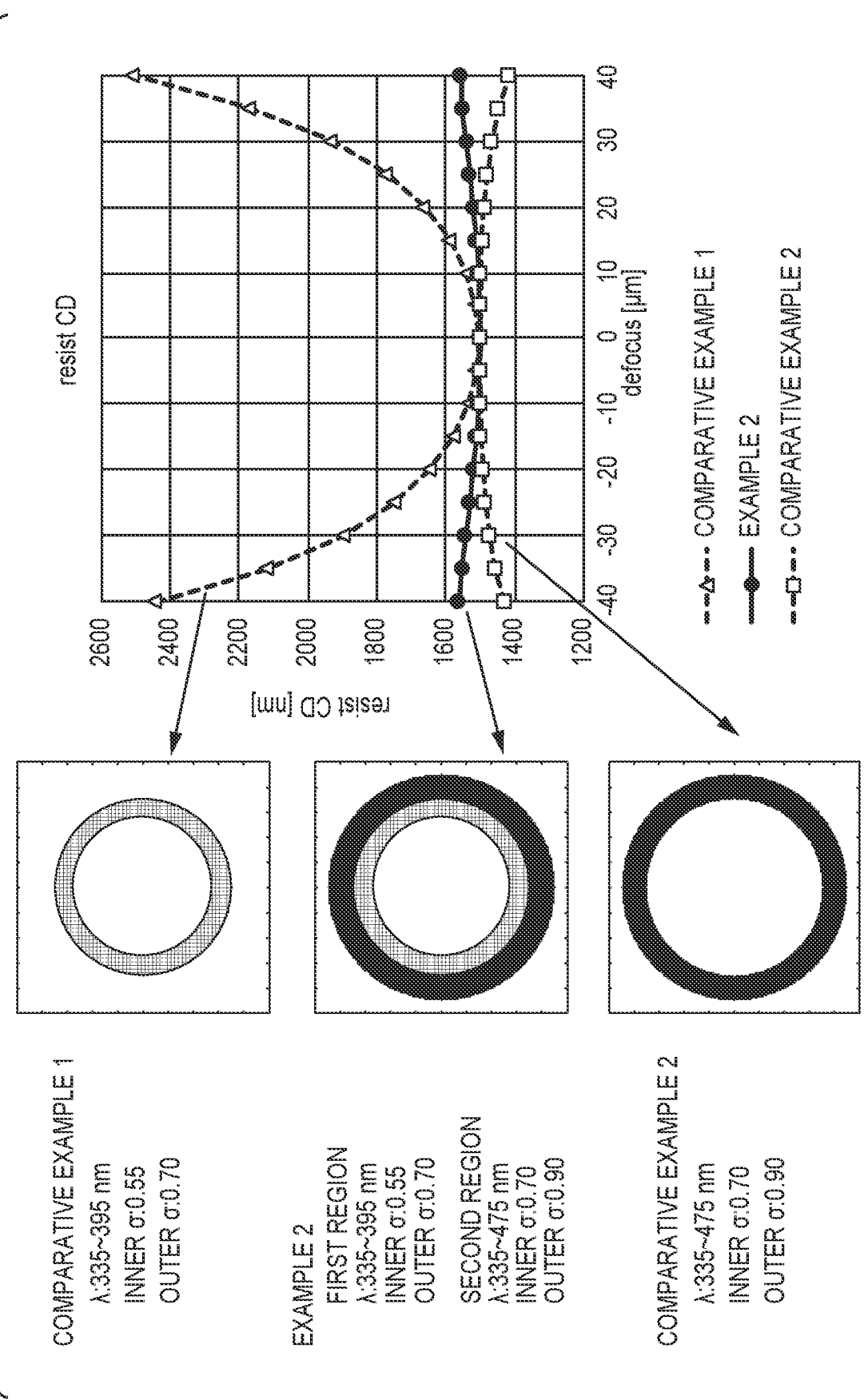
FIG. 6 is a view showing Example 2.

Modified illumination according to Example 2 will be described with reference to FIG. 6. FIG. 6 shows a change in the line width (CD) of a resist image caused by defocus in three types of modified illuminations. The numerical aperture NA was 0.10, the exposure pattern was a 7-line and space pattern with a line width of 1.5 µm. A line width change caused by a period P was 3.0 µm. A line width change caused by defocus was of the center line. Illumination of Comparative Example 1 was annular illumination using a wavelength λ of 335 to 395 nm, an inner σ of 0.55, and an outer σ of 0.70.

In Comparative Example 1, the change in the line width caused by defocus was a positive value, and the line width was increased by defocus. Illumination of Comparative Example 2 was annular illumination using a wavelength λ of 335 to 475 nm, an inner σ of 0.70, and an outer σ of 0.90. The change in the line width caused by defocus was a negative value, and the line width was decreased by defocus. Illumination of Example 2 corresponds to illumination obtained by causing both the first region formed by the illumination of Comparative Example 1 and the second region formed by the illumination of Comparative Example 2 to emit light. In the illumination of Example 2, since the changes in the line width caused by defocus of resist images formed by light beams from the first region and the second region had signs different from each other, the change in the line width caused by defocus became small, and the focal depth increased. As in Example 2, wavelengths (wavelength ranges) different from each other can be used in the first region and the second region.

Even if the first region has an inner σ of 0.55 and an outer σ of 0.80, and the second region has an inner σ of 0.80 and an outer σ of 0.90, the changes in the line width caused by defocus of resist images formed by light beams from the first region and the second region have signs different from each other. In this case, the first region (inner σ: 0.55, and outer σ: 0.80) includes a region of a wavelength range of 335 to 395 nm and a region of a wavelength range of 335 to 475 nm. In this way, wavelength ranges different from each other may be included in one divided region (for example, the first region).

If illumination light beams of wavelength ranges different from each other are used, as in Example 2, illumination light that satisfies, for the pupil radius σ and the wavelength λ the pattern period P, and the numerical aperture NA of the projection optical system, $$\alpha = \lambda / (2NA \cdot P) \qquad (3)$$

is preferably included.

Equation (3) is obtained by Taylor-expanding $$\alpha = \sin(\theta/2)/NA, \sin \theta = \mu/P \qquad (4)$$

where θ is the diffraction angle.

Equation (3) is a conditional expression for suppressing a decrease in contrast caused by defocus. A wavelength range deviated from the condition of equation (3) is preferably shielded using a wavelength filter. For example, in Example 2, when inner σ is 0.55, and the outer σ is 0.70, a wavelength in the wavelength range λ=396 to 475 nm deviated from the condition of equation (3) is shielded or attenuated. The effect of suppressing a decrease in contrast caused by defocus can be obtained by making the illumination intensity lower than the illumination intensity at an inner σ of 0.70 and an outer σ of 0.90 without completely shielding the wavelength in the wavelength range λ of 396 to 475 nm. That is, the illumination intensity in the wavelength range deviated from the condition of equation (3) may be made low.

The condition of equation (3) corresponds to an illumination angle corresponding to an angle with a large diffraction intensity in a diffracted light distribution obtained by illuminating a pattern of the period P with the wavelength λ. That is, it is preferable to use modified illumination including an illumination angle corresponding to an angle with a large diffraction intensity in the diffracted light distribution of the exposure pattern.

As methods of lowering the illumination intensity in the wavelength range deviated from the condition of equation (3), for example, three illumination methods to be described below can be considered.

The first illumination method is a method of shielding or attenuating, using a wavelength filter, a long wavelength region in an inner region where the radius of annular illumination is small in broadband light from the light source. This corresponds to Example 2. In broadband light (wavelength: 335 to 475 nm) from the light source, a wavelength of 396 to 475 nm can be shielded or attenuated by a wavelength filter in an inner region with a small radius in annular illumination with an inner σ of 0.55 and an outer σ of 0.70. This method has an effect of improving the imaging performance of a line and space pattern.

The first illumination method can be expressed as follows. The first region I1 and the second region I2 each have an annular shape. The first region I1 has σ on the inner side of the second region I2, and the second region I2 has σ on the outer side of the first region I1. First light from the first region I1 has a first wavelength range λ1, and second light from the second region I2 has a second wavelength range λ2. The second wavelength range λ2 is on the long wavelength side with respect to the first wavelength range λ1. Here, let R1 be the ratio ((I1_λ2)/(I1_λ1)) of the intensity (I1_λ2) of light in the second wavelength range λ2 to the intensity (I1_λ1) of light in the first wavelength range λ1 in the first region I1. In addition, let R2 be the ratio ((I2_λ2)/(I2_λ1)) of the intensity (I2_λ2) of light in the second wavelength range λ2 to the intensity (I2_λ1) of light in the first wavelength range λ1 in the second region I2. At this time, in the first illumination method, R1 is smaller than R2.

The second illumination method is a method of shielding or attenuating, using a wavelength filter, a short wavelength region in an outer region where the radius of annular illumination is large in broadband light from the light source. This method also has an effect of improving the imaging performance of a line and space pattern. The second illumination method can be expressed as follows. The first region I1 and the second region I2 each have an annular shape. The first region I1 has σ on the inner side of the second region I2, and the second region I2 has σ on the outer side of the first region I1. First light from the first region I1 has the first wavelength range λ1, and second light from the second region I2 has the second wavelength range λ2. The second wavelength range λ2 is on the long wavelength side with respect to the first wavelength range λ1. Here, let R1 be the ratio ((I1_λ1)/(I1_λ2)) of the intensity (I1_λ1) of light in the second wavelength range λ2 to the intensity (I1_λ2) of light in the first wavelength range λ1 in the first region I1. In addition, let R2 be the ratio ((I2_λ1)/(I2_λ2)) of the intensity (I2_λ1) of light in the second wavelength range λ2 to the intensity (I2_λ2) of light in the first wavelength range λ1 in the second region I2. At this time, in the second illumination method, R1 is smaller than R2. The second illumination method is different from the first illumination method in that the numerator is not λ2 but λ1.

The third illumination method is a method of shielding or attenuating, using a wavelength filter, a long wavelength region in an outer region where the radius of annular illumination is large in broadband light from the light source. This method has an effect of improving the imaging performance of a hole pattern. The third illumination method can be expressed as follows. The first region I1 and the second region I2 each have an annular shape. The first region I1 has σ on the inner side of the second region I2, and the second region I2 has σ on the outer side of the first region I1. First light from the first region I1 has the first wavelength range λ1, and second light from the second region I2 has the second wavelength range λ2. The second wavelength range λ2 is on the long wavelength side with respect to the first wavelength range λ1. Here, let R1 be the ratio ((I1_λ2)/(I1_λ1)) of the intensity (I1_λ2) of light in the second wavelength range λ2 to the intensity (I1_λ1) of light in the first wavelength range 21 in the first region I1. In addition, let R2 be the ratio ((I2_λ2)/(I2_λ1)) of the intensity (I2_λ2) of light in the second wavelength range λ2 to the intensity (I2_λ1) of light in the first wavelength range λ1 in the second region I2. At this time, in the third illumination method, R1 is larger than R2.

Figure 7A:
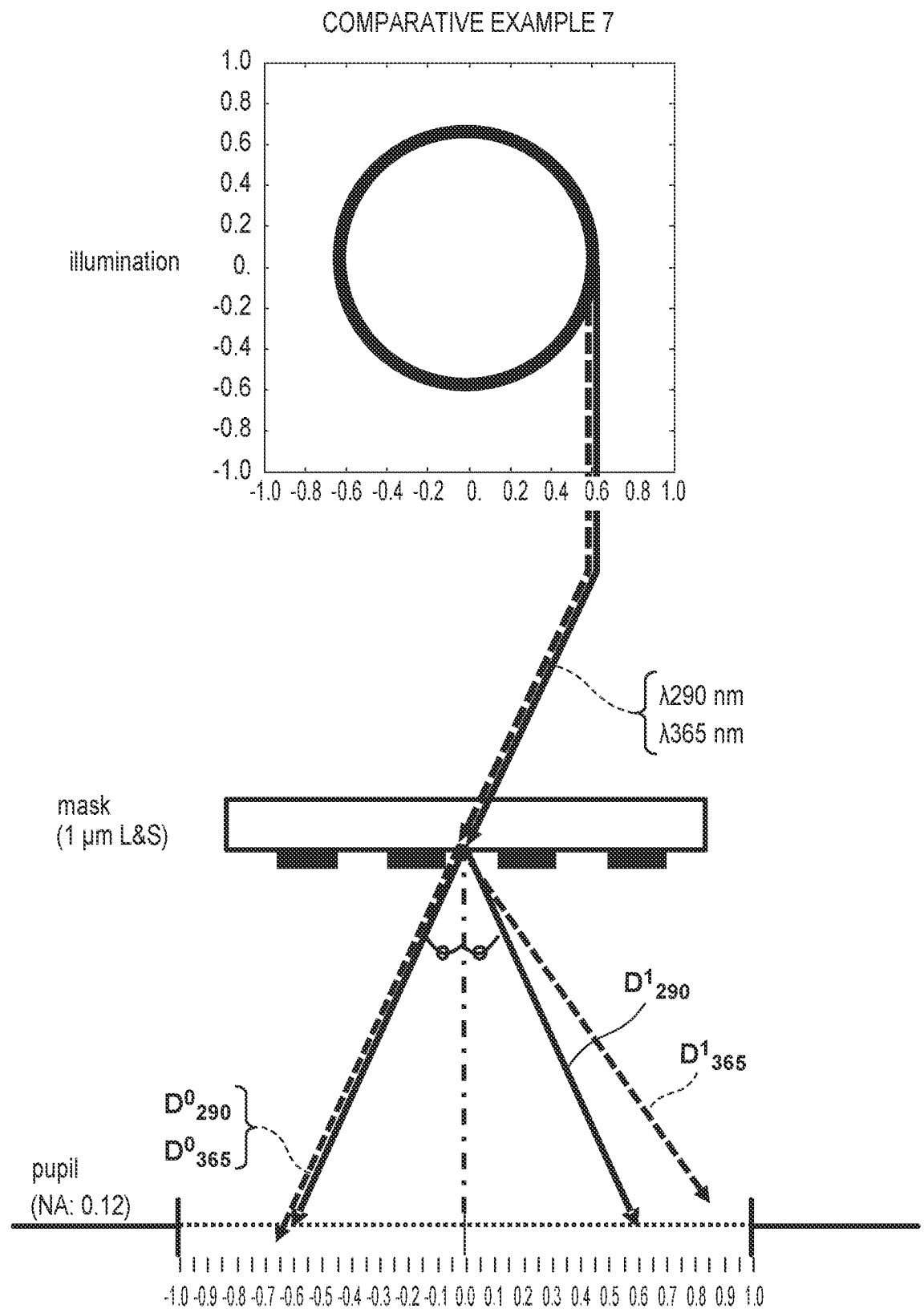
FIGS. 7A and 7B are views for explaining conditions of equation (3)
Figure 7B:
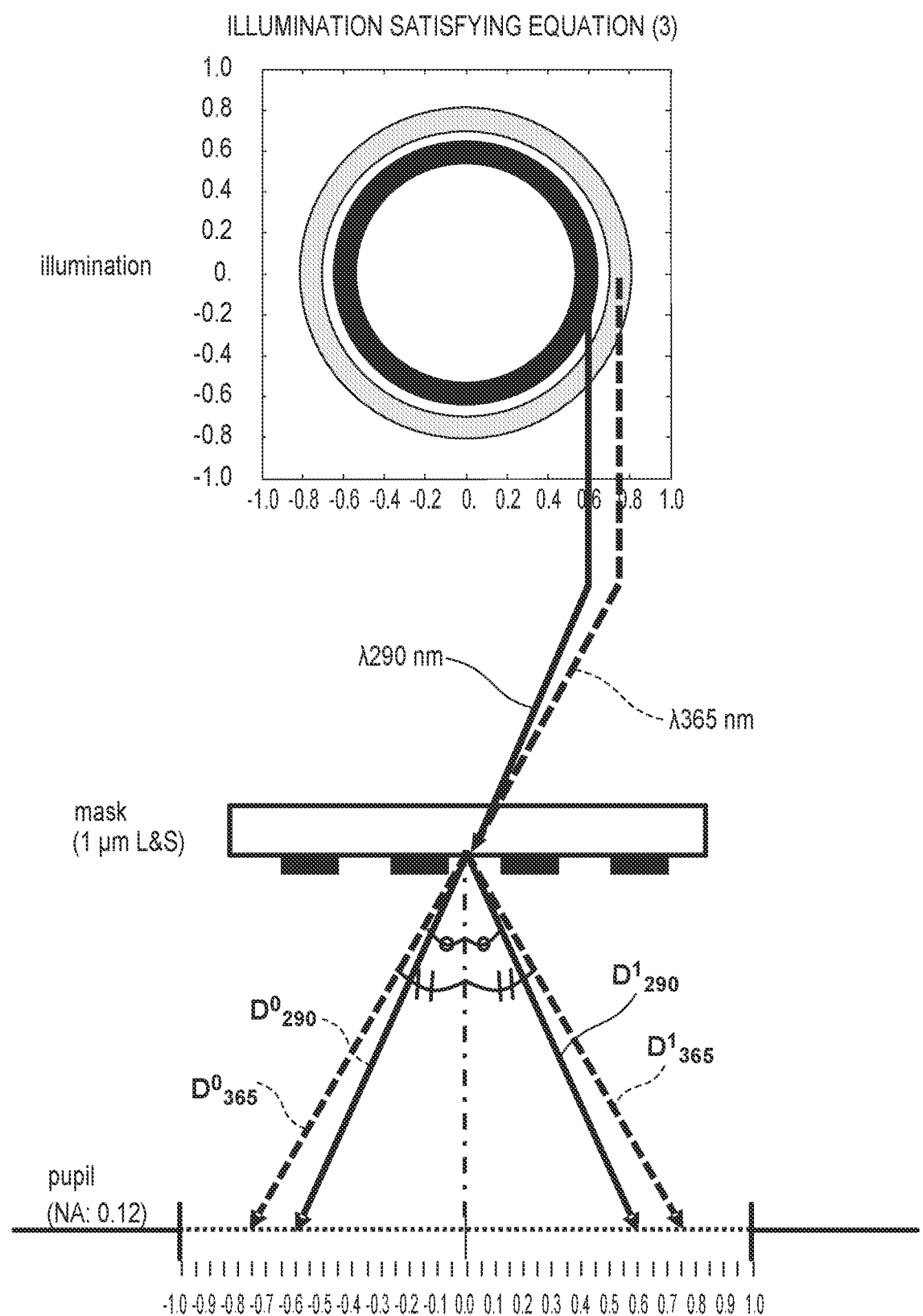

The condition of equation (3) will be described with reference to FIGS. 7A and 7B. FIG. 7A shows illumination of Comparative Example 7, and FIG. 7B shows illumination that satisfies equation (3). The pattern of the original (mask) was a line and space pattern having a line width of 1 μm, and NA was 0.12. In Comparative Example 7, modified illumination was used without considering the wavelength in broadband illumination light. For example, when annular illumination is used as modified illumination, the same annular region is set for both light of a wavelength of 290 nm and light of a wavelength of 365 nm included in broadband illumination light. The diffraction angle of diffracted light generated by the pattern of the original changes depending on the wavelength. For this reason, as shown in FIG. 7A, diffracted light $D^1_{290}$ of the wavelength of 290 nm and diffracted light $D^1_{365}$ of the wavelength of 365 nm are diffracted at angles different from each other. Hence, for example, if annular illumination optimum for $D^1_{290}$ is used, annular illumination optimum for $D^1_{365}$ cannot be obtained. Optimum annular illumination means that transmitted light (0th-order diffracted light) $D^0_\lambda$ from the original and the 1st-order diffracted light) $D^1_\lambda$ advance at equal angles in opposite directions (symmetrically) with respect to the optical axis.

In the illumination satisfying equation (3), modified illumination depending on the wavelength is set in accordance with equation (3) for broadband illumination light. As shown in FIG. 7B, annular regions different from each other are set for the light of the wavelength of 290 nm and the light of the wavelength of 365 nm included in the broadband illumination light. The illumination satisfying equation (3) is optimum annular illumination in which transmitted light $D^0_{290}$ and the 1st-order diffracted light $D^1_{290}$ concerning the light of the wavelength of 290 nm advance symmetrically at angles equal to each other with respect to the optical axis. Furthermore, the illumination satisfying equation (3) is optimum annular illumination even for the light of the wavelength of 365 nm, in which transmitted light $D^0_{365}$ and the 1st-order diffracted light $D^1_{365}$ advance symmetrically at angles equal to each other with respect to the optical axis. This annular illumination is modified illumination including an illumination angle corresponding to an angle with a large diffraction intensity in the diffracted light distribution of the exposure pattern described above.

In the annular illumination, it is preferable to reduce the inner σ or increase the outer σ of the annular region in FIG. 7B to include the annular region shown in FIG. 7B, thereby making the light emission region large and increasing the illuminance. However, setting modified illumination without considering the wavelength as in Comparative Example 2 is not preferable from the viewpoint of obtaining a large focal depth. The illumination intensity of the wavelength range deviated from the condition of equation (3) is preferably made low, as described above.

Example 3

Modified illumination according to Example 3 will be described with reference to FIG. 8. The numerical aperture NA of the projection optical system was 0.12, and the exposure pattern was a 7-line and space pattern with a line width of 1.2 μm. Except the end line width, the center line was evaluated. Illumination of Comparative Example 3 was annular illumination using a wavelength λ of 270 to 390 nm, an inner σ of 0.45, and an outer σ of 0.85.

The light emission region of the modified illumination of Example 3 included a first region having a wavelength λ of 270 to 330 nm, an inner σ of 0.45, and an outer σ of 0.60, and a second region having a wavelength λ of 330 to 390 nm, an inner σ of 0.60, and an outer σ of 0.85. A region with σ of 0.60 to 0.70 was a non-light emission region. As in Example 3, a region having a radius between the first region and the second region may be a non-light emission region.

From the viewpoint of resolving power, the image contrast improved from 0.68 to 0.69, and the side wall angle improved from 72.9° to 73.4°. The focal depth (DOF) increased from 33.4 μm to 45.3 μm. In Example 3 as well, both the resolving power performance and the focal depth performance improved. However, the end line width decreased from 1,034 nm to 1,011 nm and deteriorated.

Example 4

Figure 9:
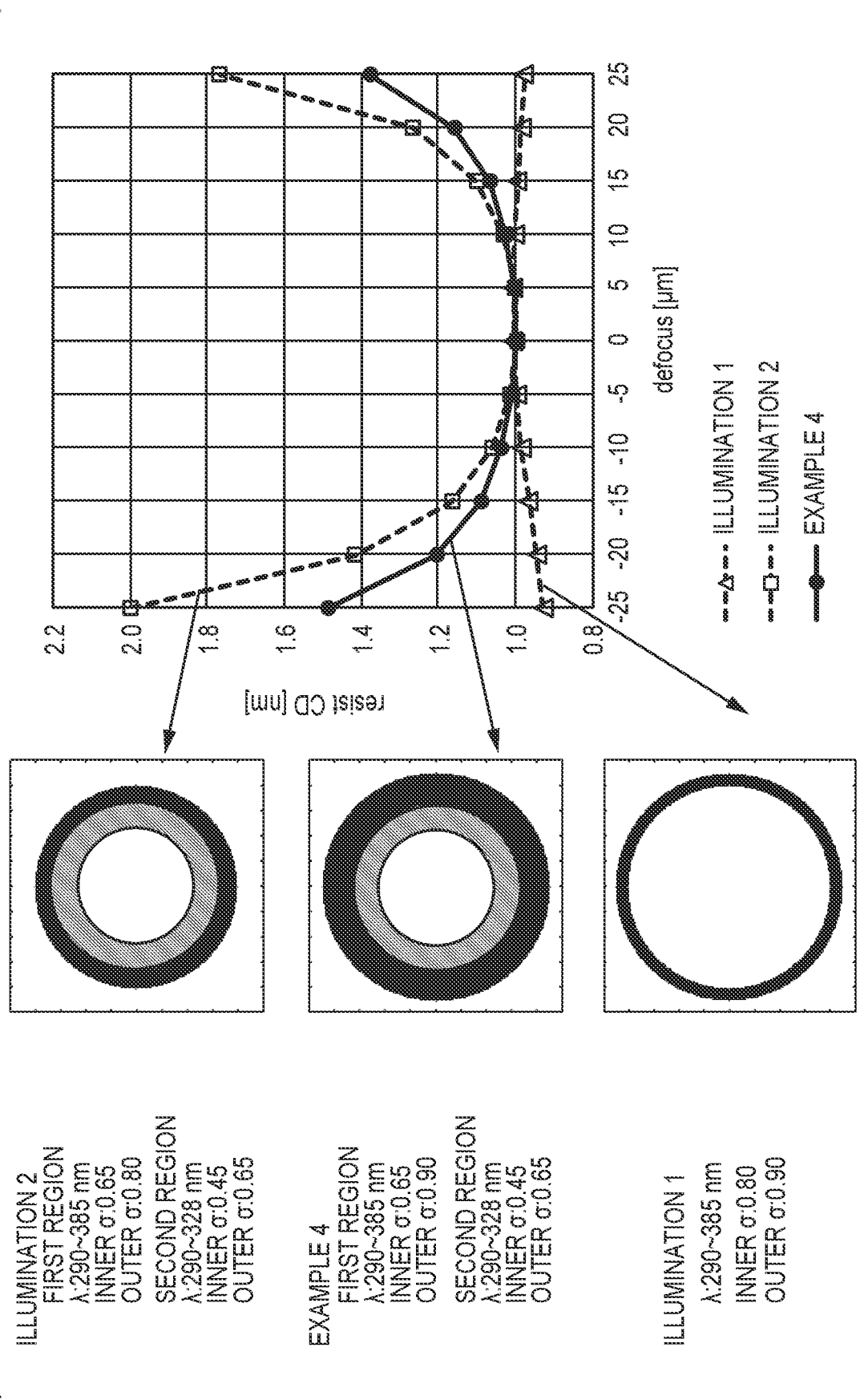
FIG. 9 is a view showing Example 4.

Modified illumination according to Example 4 will be described with reference to FIG. 9. The numerical aperture NA of the projection optical system was 0.12, and the exposure pattern was a 9-line and space pattern with a line width of 1.0 μm. The original was a phase shift mask (attenuated phase shift mask). The transmittance of the phase shift mask was 9%. FIG. 9 shows line widths CD with the abscissa representing defocus and the ordinate representing a resist pattern (a line pattern at the center of a 9-line and space pattern). A CD curve of Example 4 is indicated by a solid line. Illumination of Example 4 was a combination of illumination 1 and illumination 2. In illumination 1 and illumination 2, changes in CD for defocus have signs different from each other. In illumination 1, the CD change for defocus is small. However, since the illuminance is low, the illumination is not practical. In Example 4, a sufficient illuminance was ensured, and illumination 1 and illumination 2 in which CD changes for defocus had signs different from each other were used in combination, thereby suppressing the CD change for defocus small.

Example 5

FIG. 10 shows four examples A, B, C, and D of modified illumination according to Example 5. The second region of the example D is an example of a light source having a single wavelength (that is, a narrowband light source). As the narrowband light source, for example, a KrF laser or an ArF laser may be used. When the KrF laser or the ArF laser is used, a contrast improving effect can be obtained by shortening the wavelength. Although four examples have been described here, the However, the present invention is not limited to these examples.

Example 6

FIGS. 11A to 11G show examples of modified illumination according to Example 6. Regions indicated by black, hatching, and horizontal lines have wavelength ranges different from each other. Broadband illumination according to this embodiment does not limit the wavelength range. The wavelength range used in modified illumination may include a wavelength shorter than the i-line, and may include a wavelength longer than the g-line.

Figure 11A:
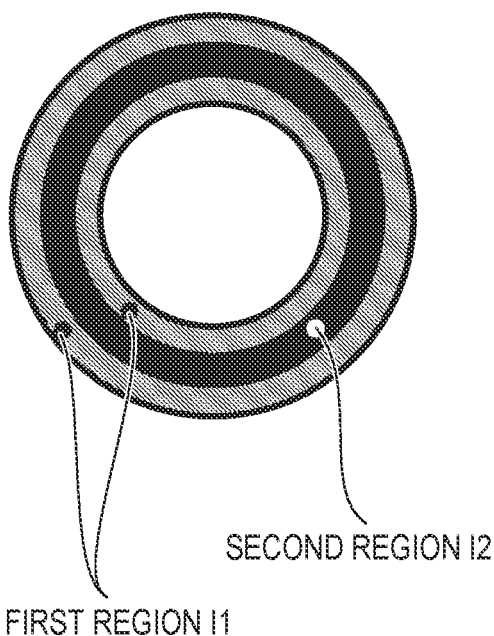
FIGS. 11A to 11G are views showing Example 6.
Figure 11B:
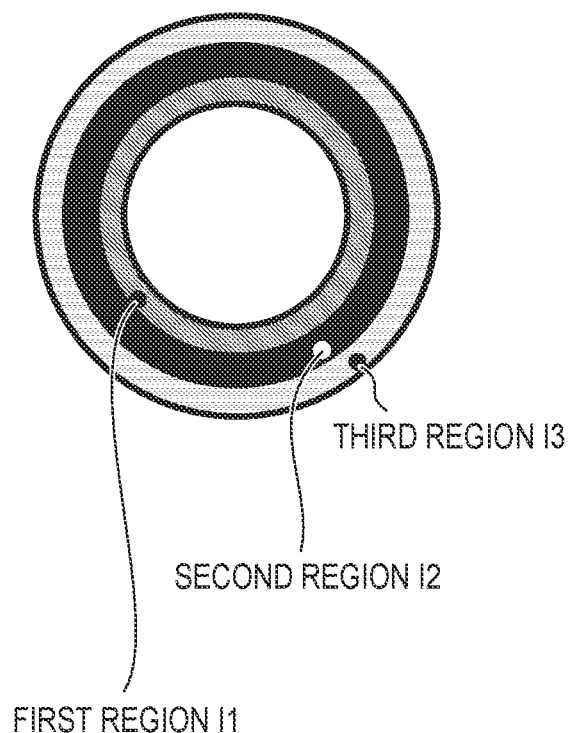
Figure 11C:
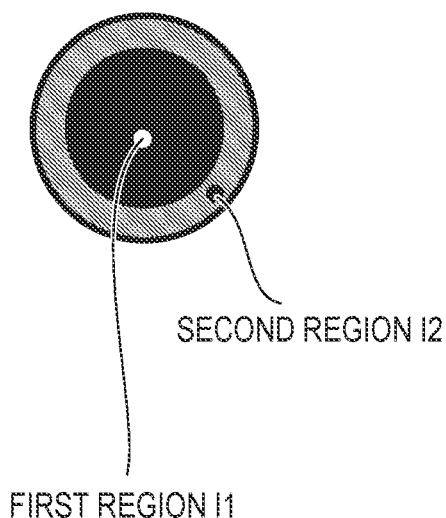
Figure 11D:
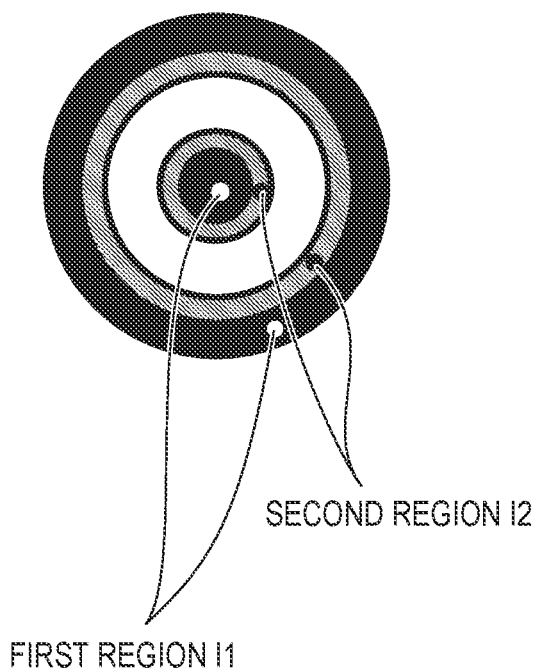

FIG. 11A shows an example in which a first region I1 of a wavelength range λ1 and a second region I2 of a wavelength range λ2 are not divided into the inner side and the outer side. FIG. 11B shows an example in which a wavelength range is divided into three ranges, a light emission region is also divided into three regions, and one wavelength range is assigned to each region. The number of divided wavelength ranges and the number of divided light emission regions may be four or more. FIG. 11C shows an example in which the wavelength range of illumination light is changed between the inner side and the outer side of illumination of small a, which is effective for, for example, a hole pattern. For example, a long wavelength is cut in the region on the outer side. This makes it possible to increase the focal depth while suppressing film thickness reduction caused by a side lobe in a case of use of a phase shift mask. FIG. 11D shows an example in which illumination of small σ and annular illumination are combined.

Figure 11E:
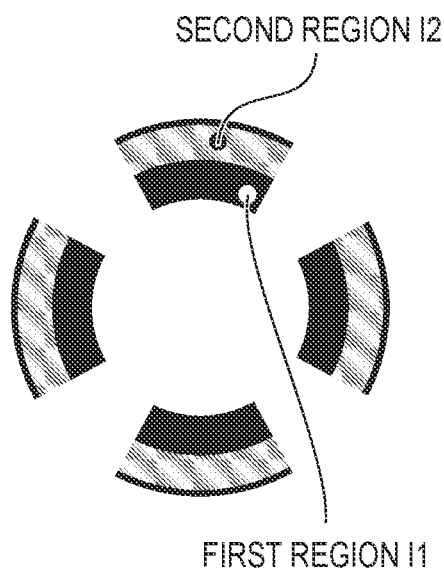
Figure 11F:
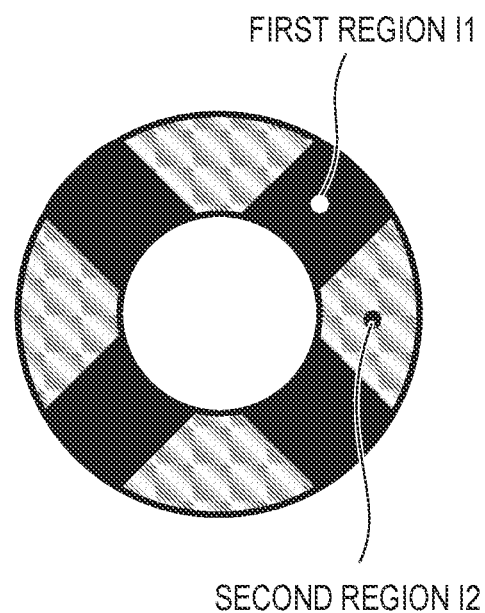
Figure 11G:
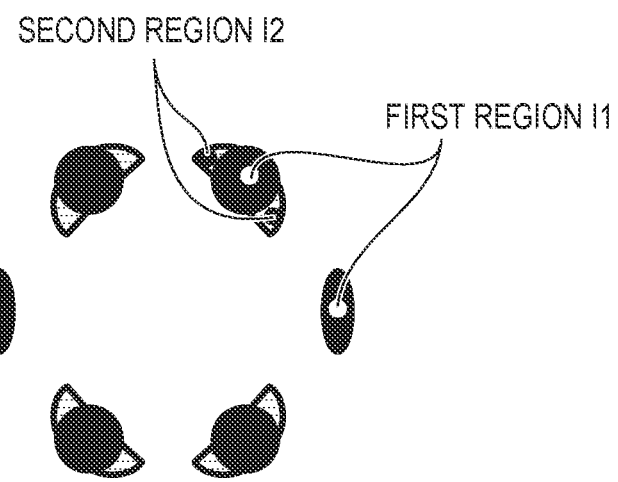

FIG. 11E shows an example in which an angle component corresponding to a specific pattern direction in annular illumination is shielded (removed). Such a direction difference may exist. FIG. 11F shows an example in which the first region I1 and the second region I2 have a common inner σ and outer σ and divided in correspondence with the pattern direction. FIG. 11G shows an example in which the light emission region is not a 90° rotation target. This example corresponds to an example in which the light emission region is decided from a region with a high diffracted light intensity of the pattern of the original. As described above, in some cases, a region with a high diffracted light intensity of the pattern of the original is not a 90° rotation target. In addition to these examples, the present invention can also be applied to polarized illumination. As described above, the present invention is not limited to annular illumination.

Figure 12A:
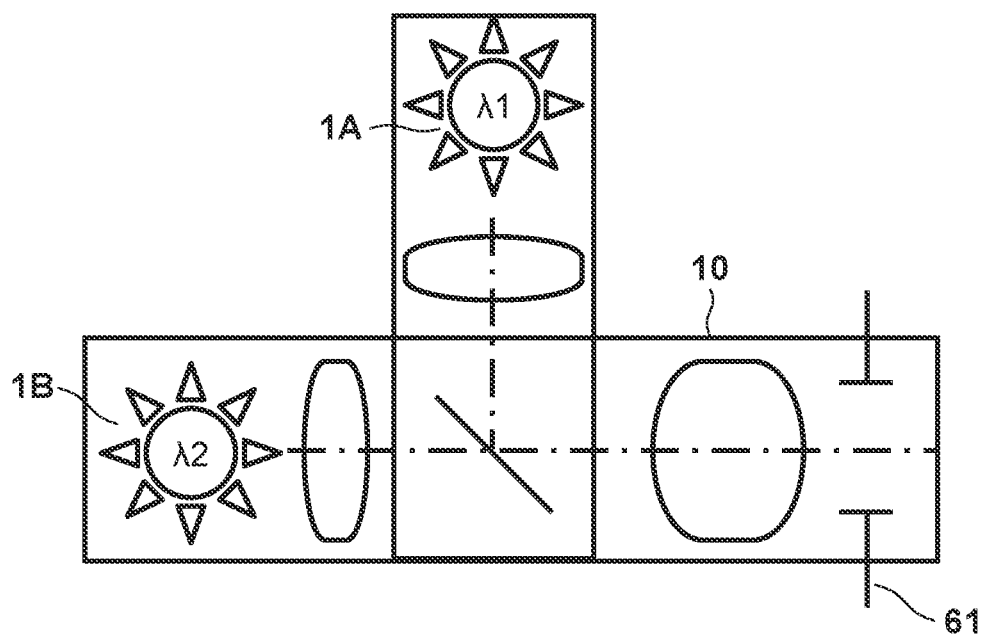
FIGS. 12A and 12B are views showing another embodiment.

Another embodiment will be described below. The arrangement of a light source 1 and an illumination optical system 10 configured to implement the above-described annular illumination will be described first with reference to FIGS. 12A and 12B. An example shown in FIG. 12A shows an example in which the light source 1 is formed by a first light source 1A and a second light source 1B. The first light source 1A and the second light source 1B emit light beams of wavelengths λ1 and λ2 different from each other. The light emitted by each of the first light source 1A and the second light source 1B may be light of a single wavelength, narrowband light, or broadband light. One of the first light source 1A and the second light source 1B may emit narrowband light, and the other may emit broadband light. Light including a plurality of wavelength ranges different from each other may be implemented as broadband light using a plurality of light sources configured to emit light of a single wavelength or narrowband light. If a first region I1 and a second region I2 have different wavelengths, modified illumination can be formed by compositing first light emitted from the first light source 1A and second light emitted from the second light source 1B. Light emission regions different from each other may be formed by the first light source 1A and the second light source 1B and then composited by the illumination optical system 10. Identical light emission regions may be formed by the first light source 1A and the second light source 1B, and the wavelength ranges in the first region I1 and the second region I2 may be changed by a wavelength filter (not shown). The first light source 1A and the second light source 1B may be LED light sources. In addition, the number of light sources forming the light source 1 is not limited to two, and may be three or more.

Figure 12B:
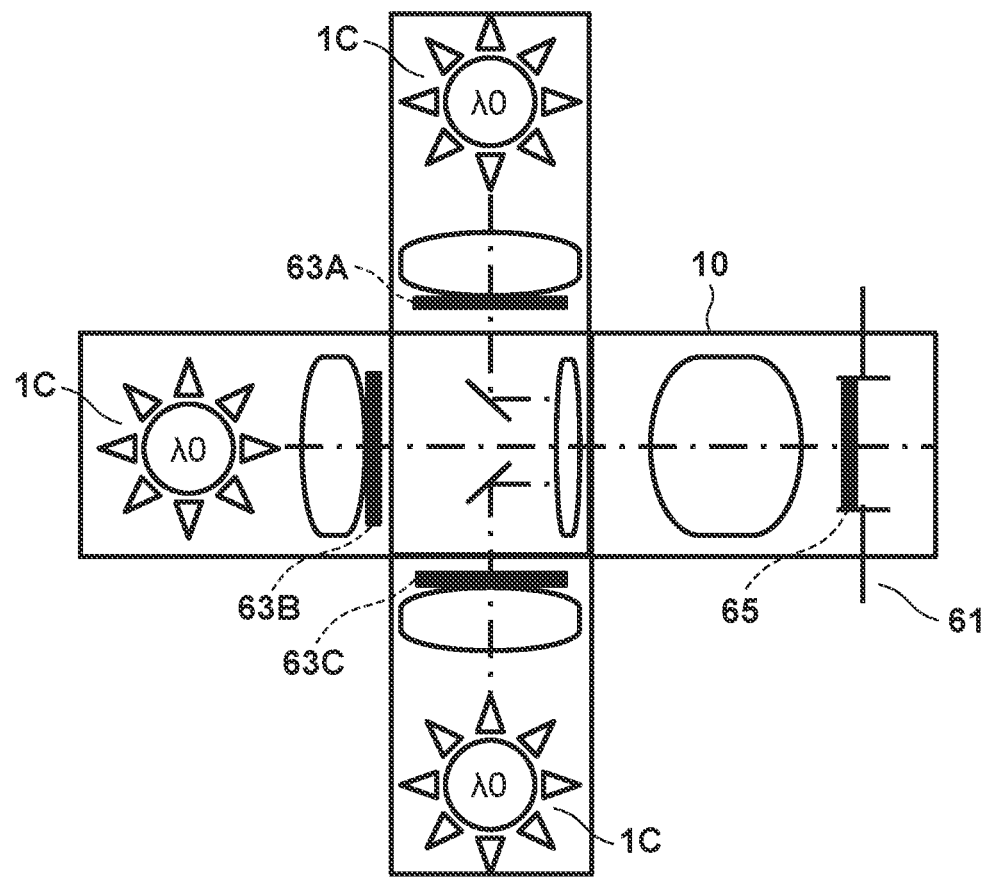

FIG. 12B shows an example in which the light source 1 is formed by three broadband light sources 1C. Each broadband light source 1C emits broadband light. In the example shown in FIG. 12B, the wavelength ranges of light beams emitted from the three broadband light sources 1C are the same. To make the plurality of regions that form the light emission region have different wavelengths, for example, a first wavelength filter 63A, a second wavelength filter 63B, and a third wavelength filter 63C may be provided for the three broadband light sources 1C, respectively, to form regions including wavelength ranges different from each other in the three light sources. Alternatively, instead of using the first wavelength filter 63A, the second wavelength filter 63B, and the third wavelength filter 63C, a fourth wavelength filter 65 may be provided. In this case, after the light beams from the three broadband light sources 1C are composited, the fourth wavelength filter 65 can form a plurality of regions forming the light emission region by light beams of wavelength ranges different from each other.

Furthermore, the first wavelength filter 63A, the second wavelength filter 63B, the third wavelength filter 63C, and the fourth wavelength filter 65 may be used together. These wavelength filters may be provided on a turning turret or may be provided on a raster-type mechanism to be shift-driven. This facilitates switching between a case in which the wavelength filters are used and a case in which the wavelength filters are not used. FIG. 12B shows an example in which the number of light sources forming the light source 1 is three. However, the number of light sources is not limited to this, and may be, for example, one. This embodiment is not intended to limit the method concerning division of the wavelength range or formation of the light emission region.

The wavelength filter needs only reduce the transmittance to a specific wavelength, and need not completely make (shield) the transmittance to a specific wavelength zero. In addition, the wavelength range need not be completely divided at the boundary portion between light emission regions. Furthermore, a decrease in the light amount (illuminance) may be suppressed not by wavelength selection by a wavelength filter but using a hologram element. A technique of improving the illuminance of annular illumination by using an axicon lens in the illumination optical system may be used. To obtain the same performance between different exposure apparatuses, illumination may be adjusted using the evaluation value of the difference between the exposure apparatuses.

An exposure method according to an embodiment and an exposure condition decision method will be described below with reference to FIGS. 13 and 14. Execution of the exposure method and the decision method is controlled by, for example, a control unit CNT. FIG. 13 shows an exposure method in an exposure apparatus 100 and an exposure condition decision method.

In step S11, illumination light is divided into a plurality of wavelengths and a plurality of illumination angles. This corresponds to dividing a wavelength range by a predetermined width (for example, at an interval of 10 nm) and dividing a radius σ of an annular region by a predetermined width (for example, at an interval of 0.05), as shown in FIG. 3. The resolution to divide the wavelength and σ can arbitrarily be set. In step S12, the line widths of images formed by performing illumination using the wavelength ranges and the illumination angles are calculated for a best focus state. The line width of an image may be calculated concerning an aerial image or a resist image. The line width of an image may be calculated in consideration of the aberration of the projection optical system.

In step S13, the line widths of images formed by performing illumination using the wavelength ranges and the illumination angles are calculated for specific defocus. The specific defocus can be decided based on a necessary focal depth and, for example, if the necessary focal depth is, for example, 30 μm in terms of range, the defocus is set to 15 μm. The line width of an image may be calculated concerning an aerial image or a resist image, and the calculation condition is preferably the same as the calculation condition in step S12.

In step S14, a change in the line width caused by defocus is calculated. This corresponds to the change in the line width shown in FIG. 3. In step S15, a first region I1 and a second region I2 in which the changes in the line width caused by defocus have signs different from each other are decided. Step S15 will be described in detail with reference to FIG. 14. In step S16, the wavelengths (the first wavelength range and the second wavelength range) of the first region I1 and the second region I2 and the illumination angles are adjusted such that the difference between the line widths caused by defocus when the original is illuminated with the first region I1 and the second region I2 becomes equal to or less than a reference value. The reference value can be decided based on a necessary accuracy. The first wavelength range, the second wavelength range, the first region I1, and the second region I2 are thus decided. For example, if a change of 10% of the line width is allowed, the reference value is 0.1 µm for a pattern of 1 µm. In step S17, conditions (exposure conditions) of modified illumination in which a light emission region including the first region I1 and the second region I2 is defined are set. In step S18, a substrate is exposed while forming a light emission region on the pupil plane of the illumination optical system 10 in accordance with the conditions (exposure conditions) of modified illumination set in step S17.

FIG. 14 shows details of step S15 in FIG. 13. In step S151, in conditions satisfying equation (3) and nearby conditions among the conditions ($\lambda$, $\sigma$) divided in step S11 of FIG. 13, condition 1 ($\lambda$, $\sigma$) under which $\Delta$CD is positive and condition 2 ($\lambda$, $\sigma$) under which $\Delta$CD is negative are decided. A nearby condition is, for example, that the $\sigma$ difference is 0.30 or less, and the wavelength difference is 100 nm or less. The condition can arbitrarily be set. In step S152, a region of $\sigma$ including many conditions 1 is selected, and this region is defined as ($\sigma$1in, $\sigma$1out). At this time, to increase the illuminance of illumination, the selection is preferably done such that the annular width becomes larger than a threshold. In step S153, a region of $\sigma$ including many conditions 2 is selected so it does not overlap ($\sigma$1in, $\sigma$1out), and this region is defined as ($\sigma$2in, $\sigma$2out). At this time, to increase the illuminance of illumination, the selection is preferably done such that the annular width becomes larger than a threshold.

In step S154, for the condition ($\lambda$, $\sigma$) within the range of ($\sigma$1in, $\sigma$1out), a wavelength range $\lambda$1 is decided such that the wavelength width becomes larger than a threshold, and the sum of $\Delta$CD of conditions included in the wavelength width becomes positive. The threshold of the wavelength width is, for example, a full width at half maximum of 10 nm, which is the condition of a broadband wavelength. In step S155, for the condition ($\lambda$, $\sigma$) within the range of ($\sigma$2in, $\sigma$2out), a wavelength range $\lambda$2 is decided such that the wavelength width becomes larger than a threshold, and the sum of $\Delta$CD of conditions included in the wavelength width becomes negative. The threshold of the wavelength width is, for example, a full width at half maximum of 10 nm, which is the condition of a broadband wavelength. In step S156, a region defined by $\lambda$1 and ($\sigma$1in, $\sigma$1out) is decided as the first region I1. In step S157, a region defined by $\lambda$2 and ($\sigma$2in, $\sigma$2out) is decided as the second region I2. In this way, the first region I1 and the second region I2 in step S15 of FIG. 13 are decided.

An article manufacturing method of manufacturing an article using an exposure apparatus represented by the above-described embodiment will be described below. The article can be, for example, a flat panel display, a semiconductor element, a MEMS, or the like. The article is manufactured, using the above-described exposure apparatus, by exposing a substrate (a plate, a wafer, a glass substrate, or the like) to which a photoresist is applied, developing the substrate (photoresist), and processing the developed substrate by another known process. Another known process includes etching, resist peeling, dicing, bonding, packaging, and the like. According to the article manufacturing method, an article of higher quality can be manufactured as compared to before.

The embodiments of the present invention have been described above. The present invention is not limited to these embodiments, as a matter of course, and various changes and modifications can be made within the scope of the present invention. For example, the present invention can also be applied to an exposure apparatus using a projection optical system of a non-1x system such as an enlargement system or a reduction system, a maskless projection optical system, multiple exposure, or an LED light source. The mask is not limited to a binary mask, and a phase shift mask may be used.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-093918, filed May 17, 2019, which is hereby incorporated by reference herein in its entirety.

What is claimed is:

1. An exposure apparatus including an illumination optical system, and a projection optical system configured to form a projected image on a substrate with light provided from the illumination optical system, wherein the illumination optical system forms, on a pupil plane of the illumination optical system, a light emission region including a first region and a second region, the projected image is composited from a plurality of images including a first image formed by first light from the first region and a second image formed by second light from the second region, at least one of the first light and the second light is broadband light, and an increase/decrease change in a line width in the second image caused by defocus has a different sign with respect to an increase/decrease change in a line width in the first image caused by defocus, wherein each of the first region and the second region has an annular shape, the first region has a radius on an inner side of the second region, and the second region has a radius on an outer side of the first region, and a second wavelength range that is a wavelength range of the second light is on a long wavelength side with respect to a first wavelength range that is a wavelength range of the first light.

2. The apparatus according to claim 1, wherein both the first light and the second light are broadband light.

3. The apparatus according to claim 1, wherein the broadband light has a band including a plurality of bright lines generated by a mercury lamp.

4. The apparatus according to claim 1, wherein a wavelength of the first light and a wavelength of the second light are different from each other.

5. The apparatus according to claim 1, wherein letting R1 be a ratio $((I1\_\lambda 2)/(I1\_\lambda 1))$ of an intensity $(I1\_\lambda 2)$ of light in the second wavelength range to an intensity $(I1\_\lambda 1)$ of light in the first wavelength range in the first region, and R2 be a ratio $((I2\_\lambda 2)/(I2\_\lambda 1))$ of an intensity $(I2\_\lambda 2)$ of light in the second wavelength range to an intensity $(I2\_\lambda 1)$ of light in the first wavelength range in the second region, R1 is smaller than R2.

6. The apparatus according to claim 1, wherein letting R1 be a ratio $((I1\_\lambda 1)/(I1\_\lambda 2))$ of an intensity $(I1\_\lambda 1)$ of light in the second wavelength range to an intensity $(I1\_\lambda 2)$ of light in the first wavelength range in the first region, and R2 be a ratio $((I2\_\lambda 1)/(I2\_\lambda 2))$ of an intensity $(I2\_\lambda 1)$ of light in the second wavelength range to an intensity $(I2\_\lambda 2)$ of light in the first wavelength range in the second region, R1 is smaller than R2.

7. The apparatus according to claim 1, wherein letting R1 be a ratio $((I1\_\lambda 2)/(I1\_\lambda 1))$ of an intensity $(I1\_\lambda 2)$ of light in the second wavelength range to an intensity $(I1\_\lambda 1)$ of light in the first wavelength range in the first region, and R2 be a ratio $((I2\_\lambda 2)/(I2\_\lambda 1))$ of an intensity $(I2\_\lambda 2)$ of light in the second wavelength range to an intensity $(I2\_\lambda 1)$ of light in the first wavelength range in the second region, R1 is larger than R2.

8. The apparatus according to claim 1, wherein letting P be a period of the projected image, NA be a numerical aperture of the projection optical system, and $\lambda 1$ be a wavelength of the first light, the first region includes a region having a radius defined by $$1/(2NA \cdot P).$$

9. The apparatus according to claim 1, wherein the illumination optical system includes a light source configured to generate light having a wavelength of not more than 350 nm.

10. The apparatus according to claim 1, wherein the first region and the second region are regions exclusive of each other.

11. An exposure method by an exposure apparatus including an illumination optical system, and a projection optical system configured to form a projected image on a substrate by light provided from the illumination optical system, wherein the illumination optical system forms, on a pupil plane of the illumination optical system, a light emission region including a first region and a second region, the projected image is composited from a plurality of images including a first image formed by first light from the first region and a second image formed by second light from the second region, at least one of the first light and the second light is broadband light, and the exposure method comprises exposing the substrate while forming the light emission region such that an increase/decrease change in a line width in the second image caused by defocus has a different sign with respect to an increase/decrease change in a line width in the first image caused by defocus, wherein each of the first region and the second region has an annular shape, the first region has a radius on an inner side of the second region, and the second region has a radius on an outer side of the first region, and a second wavelength range that is a wavelength range of the second light is on a long wavelength side with respect to a first wavelength range that is a wavelength range of the first light.

12. A decision method of deciding an exposure condition in an exposure apparatus including an illumination optical system, and a projection optical system configured to form a projected image on a substrate by light provided from the illumination optical system, wherein the illumination optical system forms, on a pupil plane of the illumination optical system, a light emission region including a first region and a second region, the projected image is composited from a plurality of images including a first image formed by first light from the first region and a second image formed by second light from the second region, at least one of the first light and the second light is broadband light, and the decision method comprises deciding a wavelength range of the first light, a wavelength range of the second light, the first region, and the second region such that an increase/decrease change in a line width in the second image caused by defocus has a different sign with respect to an increase/decrease change in a line width in the first image caused by defocus, wherein each of the first region and the second region has an annular shape, the first region has a radius on an inner side of the second region, and the second region has a radius on an outer side of the first region, and a second wavelength range that is a wavelength range of the second light is on a long wavelength side with respect to a first wavelength range that is a wavelength range of the first light.

13. An article manufacturing method comprising:
exposing a substrate using an exposure apparatus of claim 1;
developing the exposed substrate; and
manufacturing an article from the developed substrate,
wherein the exposure apparatus comprises:
an illumination optical system, and a projection optical system configured to form a projected image on a substrate with light provided from the illumination optical system,
wherein the illumination optical system forms, on a pupil plane of the illumination optical system, a light emission region including a first region and a second region,
the projected image is composited from a plurality of images including a first image formed by first light from the first region and a second image formed by second light from the second region,
at least one of the first light and the second light is broadband light, and
an increase/decrease change in a line width in the second image caused by defocus has a different sign with respect to an increase/decrease change in a line width in the first image caused by defocus,
wherein
each of the first region and the second region has an annular shape,
the first region has a radius on an inner side of the second region, and the second region has a radius on an outer side of the first region, and
a second wavelength range that is a wavelength range of the second light is on a long wavelength side with respect to a first wavelength range that is a wavelength range of the first light.

14. An exposure apparatus including an illumination optical system, and a projection optical system configured to form a projected image on a substrate with light provided from the illumination optical system,
wherein a light emission region including a first region and a second region is formed on a pupil plane of the illumination optical system,
the projected image is composited from a plurality of images including a first image formed by first light from the first region and a second image formed by second light from the second region, and
an increase/decrease change in a line width in the second image caused by defocus has a different sign with respect to an increase/decrease change in a line width in the first image caused by defocus,
wherein
the first region includes a region arranged inside the second region, and
a wavelength range of the second light has a wavelength longer than the maximum wavelength of a wavelength range of the first light.

15. The apparatus according to claim 14, wherein each of the first region and the second region has a shape of 4-fold rotational symmetry.

16. The apparatus according to claim 14, wherein each of the first region and the second region has an annular shape.

17. An exposure method by an exposure apparatus including an illumination optical system, and a projection optical system configured to form a projected image on a substrate by light provided from the illumination optical system,
wherein a light emission region including a first region and a second region is formed on a pupil plane of the illumination optical system,
the projected image is composited from a plurality of images including a first image formed by first light from the first region and a second image formed by second light from the second region, and
an increase/decrease change in a line width in the second image caused by defocus has a different sign with respect to an increase/decrease change in a line width in the first image caused by defocus,
wherein
the first region includes a region arranged inside the second region, and
a wavelength range of the second light has a wavelength longer than the maximum wavelength of a wavelength range of the first light.

18. An article manufacturing method comprising:
exposing a substrate using an exposure apparatus;
developing the exposed substrate; and
manufacturing an article from the developed substrate,
wherein the exposure apparatus comprises:
an illumination optical system, and a projection optical system configured to form a projected image on a substrate with light provided from the illumination optical system,
wherein a light emission region including a first region and a second region is formed on a pupil plane of the illumination optical system,
the projected image is composited from a plurality of images including a first image formed by first light from the first region and a second image formed by second light from the second region, and
an increase/decrease change in a line width in the second image caused by defocus has a different sign with respect to an increase/decrease change in a line width in the first image caused by defocus,
wherein
the first region includes a region arranged inside the second region, and
a wavelength range of the second light has a wavelength longer than the maximum wavelength of a wavelength range of the first light.

* * * * *